(12) United States Patent
Ikeda et al.

(10) Patent No.: US 9,349,454 B2
(45) Date of Patent: May 24, 2016

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Takayuki Ikeda, Kanagawa (JP); Yoshiyuki Kurokawa, Kanagawa (JP); Munehiro Kozuma, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/636,792

(22) Filed: Mar. 3, 2015

(65) Prior Publication Data

US 2015/0255157 A1    Sep. 10, 2015

(30) Foreign Application Priority Data

Mar. 7, 2014    (JP) ................... 2014-045282

(51) Int. Cl.
*G11C 16/04*    (2006.01)
*G11C 16/10*    (2006.01)

(52) U.S. Cl.
CPC ............ *G11C 16/0441* (2013.01); *G11C 16/10* (2013.01)

(58) Field of Classification Search
CPC .... G11C 16/04; G11C 16/0441; G11C 16/06; G11C 16/10; G11C 16/30; G11C 5/14; G11C 5/147
USPC ........................... 365/185.23, 189.09, 189.11
See application file for complete search history.

(56) References Cited

U.S. PATENT DOCUMENTS

| | | |
|---|---|---|
| 5,254,928 A | 10/1993 | Young et al. |
| 5,489,870 A | 2/1996 | Arakawa |
| 5,493,255 A | 2/1996 | Murtojarvi |
| 5,497,119 A | 3/1996 | Tedrow et al. |
| 5,546,042 A | 8/1996 | Tedrow et al. |
| 5,731,856 A | 3/1998 | Kim et al. |

(Continued)

FOREIGN PATENT DOCUMENTS

| | | |
|---|---|---|
| EP | 0150606 | 8/1985 |
| EP | 1737044 A | 12/2006 |

(Continued)

OTHER PUBLICATIONS

Kobayashi.H et al., "Processor with 4.9-μs break-even time in power gating using crystalline In—Ga—Zn—oxide transistor", Cool Chips XVI, Apr. 17, 2013, pp. 1-3.

(Continued)

*Primary Examiner* — Tan T. Nguyen
(74) *Attorney, Agent, or Firm* — Fish & Richardson P.C.

(57) ABSTRACT

A semiconductor device capable of generating a signal (e.g., a potential signal or a current signal) suitable for usage environment or a purpose. The semiconductor device includes a first memory circuit, a first circuit, and a second memory circuit. The first circuit converts a digital signal input from the first memory circuit into an analog signal. The first memory circuit includes an input node, an output node, a transistor, and a capacitor. The capacitor is electrically connected to the output node. The transistor can control a conduction state between the input node and the output node. An analog signal is input to the input node from the first circuit. The transistor includes an oxide semiconductor layer where a channel formation region is formed.

14 Claims, 11 Drawing Sheets

(56) References Cited

U.S. PATENT DOCUMENTS

| | | |
|---|---|---|
| 5,744,864 A | 4/1998 | Cillessen et al. |
| 5,815,446 A | 9/1998 | Tobita |
| 5,821,805 A | 10/1998 | Jinbo |
| 5,892,267 A | 4/1999 | Takada |
| 5,936,455 A | 8/1999 | Kobayashi et al. |
| 6,049,246 A | 4/2000 | Kozisek et al. |
| 6,069,518 A | 5/2000 | Nakai et al. |
| 6,163,487 A | 12/2000 | Ghilardelli |
| 6,172,886 B1 | 1/2001 | Lauterbach et al. |
| 6,175,264 B1 | 1/2001 | Jinbo |
| 6,294,274 B1 | 9/2001 | Kawazoe et al. |
| 6,373,325 B1 | 4/2002 | Kuriyama |
| 6,549,196 B1 | 4/2003 | Taguchi et al. |
| 6,559,628 B2 | 5/2003 | Kim |
| 6,563,174 B2 | 5/2003 | Kawasaki et al. |
| 6,603,346 B2 | 8/2003 | Sawada et al. |
| 6,664,846 B1 | 12/2003 | Maung et al. |
| 6,696,869 B1 | 2/2004 | Tan |
| 6,710,734 B2 | 3/2004 | Ono et al. |
| 6,720,822 B2 | 4/2004 | Torrisi et al. |
| 6,727,522 B1 | 4/2004 | Kawasaki et al. |
| 6,747,897 B2 | 6/2004 | Karaki |
| 6,791,882 B2 | 9/2004 | Seki et al. |
| 6,794,916 B1 | 9/2004 | Varma |
| 6,847,250 B2 | 1/2005 | Kim |
| 6,888,526 B2 | 5/2005 | Morita |
| 6,914,791 B1 | 7/2005 | Park et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,277,038 B2 | 10/2007 | Yada et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,538,673 B2 | 5/2009 | Balachandran et al. |
| 7,602,231 B2 | 10/2009 | Yamamoto et al. |
| 7,674,650 B2 | 3/2010 | Akimoto et al. |
| 7,732,819 B2 | 6/2010 | Akimoto et al. |
| 7,777,557 B2 | 8/2010 | Yamahira |
| 7,948,304 B2 | 5/2011 | Aruga et al. |
| 8,004,907 B2 | 8/2011 | Russell et al. |
| 8,107,279 B2 | 1/2012 | Yamaoka et al. |
| 8,209,504 B2 | 6/2012 | Nakanishi et al. |
| 8,222,953 B2 | 7/2012 | Nakamura |
| 8,294,380 B2 | 10/2012 | Bairanzade |
| 8,467,825 B2 | 6/2013 | Kato et al. |
| 8,598,945 B2 | 12/2013 | Gorisse |
| 8,614,916 B2 | 12/2013 | Nagatsuka et al. |
| 8,675,382 B2 | 3/2014 | Kurokawa |
| 8,773,906 B2 | 7/2014 | Ohmaru |
| 8,896,042 B2 | 11/2014 | Yamazaki et al. |
| 2001/0046027 A1 | 11/2001 | Tai et al. |
| 2002/0000985 A1 | 1/2002 | Hashimoto |
| 2002/0056838 A1 | 5/2002 | Ogawa |
| 2002/0084775 A1 | 7/2002 | Kim |
| 2002/0132454 A1 | 9/2002 | Ohtsu et al. |
| 2003/0184360 A1 | 10/2003 | Wang et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0150653 A1 | 8/2004 | Sakamaki et al. |
| 2004/0240278 A1* | 12/2004 | Brady .................... G11C 7/14 365/189.09 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0152400 A1 | 7/2006 | Yada et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0255874 A1 | 11/2006 | Okazaki et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0046474 A1 | 3/2007 | Balachandran et al. |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0310221 A1* | 12/2008 | Baker .................... G11C 5/147 365/185.2 |
| 2009/0068773 A1 | 3/2009 | Lai et al. |
| 2009/0073325 A1 | 3/2009 | Kuwabara et al. |
| 2009/0102120 A1 | 4/2009 | Hou et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320925 A1 | 12/2010 | Bairanzade |
| 2011/0012822 A1 | 1/2011 | Park et al. |
| 2011/0074508 A1 | 3/2011 | Imura |
| 2011/0089927 A1 | 4/2011 | Yamazaki et al. |
| 2011/0101942 A1 | 5/2011 | Yamazaki et al. |
| 2011/0149185 A1 | 6/2011 | Yamazaki |
| 2011/0216566 A1 | 9/2011 | Kamata |
| 2012/0049901 A1 | 3/2012 | Takewaki et al. |

(56) References Cited

U.S. PATENT DOCUMENTS

| | | | |
|---|---|---|---|
| 2012/0161139 | A1 | 6/2012 | Endo et al. |
| 2012/0176392 | A1 | 7/2012 | Uchida et al. |
| 2012/0193620 | A1 | 8/2012 | Godo et al. |
| 2012/0195138 | A1 | 8/2012 | Son |
| 2012/0231581 | A1 | 9/2012 | Yamazaki et al. |
| 2012/0274361 | A1 | 11/2012 | Miyake |
| 2012/0274401 | A1 | 11/2012 | Watanabe |
| 2012/0313762 | A1 | 12/2012 | Ohshima et al. |
| 2013/0027018 | A1 | 1/2013 | Okano |
| 2013/0162227 | A1 | 6/2013 | Kodama et al. |
| 2013/0271220 | A1 | 10/2013 | Takahashi et al. |
| 2013/0300462 | A1 | 11/2013 | Koyama et al. |
| 2013/0307496 | A1 | 11/2013 | Watanabe |
| 2013/0314152 | A1 | 11/2013 | Matsuzaki et al. |
| 2014/0068301 | A1 | 3/2014 | Watanabe |
| 2014/0077786 | A1 | 3/2014 | Shionoiri et al. |
| 2014/0266379 | A1 | 9/2014 | Inoue et al. |
| 2015/0054550 | A1 | 2/2015 | Koyama et al. |
| 2015/0054571 | A1 | 2/2015 | Watanabe et al. |

FOREIGN PATENT DOCUMENTS

| | | | |
|---|---|---|---|
| EP | 2226847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2002-319863 | | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2011-119675 | | 6/2011 |
| JP | 2012-186797 | | 9/2012 |
| JP | 2013-016155 | | 1/2013 |
| WO | WO-2004/114391 | | 12/2004 |

OTHER PUBLICATIONS

Nagatsuka.S et al., "A 3bit/cell Nonvolatile Memory with Crystalline In—Ga—Zn—O TFT", IMW 2013 (5th IEEE International Memory Workshop), May 26, 2013, pp. 188-191.

Kato.K et al., "Evaluation of Off-State Current Characteristics of Transistor Using Oxide Semiconductor Material, Indium.Gallium. Zinc Oxide", Jpn. J. Appl. Phys. (Japanese Journal of Applied Physics), 2012, vol. 51, pp. 021201-1-021201-7.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

(56) References Cited

OTHER PUBLICATIONS

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IgZo Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga-Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

(56) References Cited

OTHER PUBLICATIONS

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

SEMICONDUCTOR DEVICE AND ELECTRONIC DEVICE

BACKGROUND OF THE INVENTION

1. Field of the Invention

One embodiment of the present invention relates to a semiconductor device, a driving method thereof, a manufacturing method thereof, and the like.

Note that one embodiment of the present invention is not limited to the above technical field. The technical field of one embodiment of the invention disclosed in the specification, the drawings, and the claims (hereinafter referred to as "this specification and the like") relates to an object, a method, or a manufacturing method. Furthermore, one embodiment of the present invention relates to a process, a machine, manufacture, or a composition of matter. Specifically, examples of the technical field of one embodiment of the present invention disclosed in this specification and the like include a semiconductor device, a display device, a liquid crystal display device, a light-emitting device, a lighting device, a power storage device, a storage device, a method of driving any of them, and a method of manufacturing any of them.

2. Description of the Related Art

A transistor in which a channel is formed using an oxide semiconductor (OS) such as an In—Ga—Zn oxide (In—Ga—Zn—O) (such a transistor is referred to as an OS transistor below) is known. The OS transistor has an extremely low off-state current than a Si transistor because the oxide semiconductor has a wider band gap than silicon. As a semiconductor device including an OS transistor, for example, a semiconductor memory device (Patent Document 1), a programmable logic device (Patent Document 2), and a wireless tag (Patent Document 3) are suggested.

For a circuit that processes analog signals such as an operational amplifier circuit, a potential generating circuit that generates an optimum potential for the circuit operation is needed. For example, a bandgap-reference potential generating circuit is known as the potential generating circuit.

REFERENCE

Patent Document

[Patent Document 1] Japanese Published Patent Application No. 2011-119675
[Patent Document 2] Japanese Published Patent Application No. 2012-186797
[Patent Document 3] Japanese Published Patent Application No. 2013-016155

SUMMARY OF THE INVENTION

A general operational amplifier circuit needs a circuit corresponding to a current source, and the value of current output from the current source is controlled by a bias potential. When the value of current output from the current source is small, power consumption can be low; however, the operation speed of the operational amplifier is decreased. Therefore, it is preferable that the value of the bias potential be optimized to purposes in the operational amplifier. However, the optimum value of the bias potential changes in each operational amplifier depending on variations in manufacturing steps, usage environment, and the like.

To solve this problem, for example, suggested is a method of generating a bias potential (analog potential) in such a manner that correction data for controlling the bias potential is stored in a flash memory, and the correction data is converted from digital to analog. However, various situations must be considered because the number of rewriting times to the flash memory is restricted, and a large amount of correction data is needed, that is, a large-capacity flash memory is needed. In this method, correction data is always read out from the flash memory while the operational amplifier is operated, which increases power consumption.

An object of one embodiment of the present invention is to provide a novel semiconductor device or a novel method of driving or manufacturing the semiconductor device. For example, an object of one embodiment of the present invention is to provide a novel semiconductor device including an OS transistor, a novel method of driving or manufacturing the semiconductor device including an OS transistor. Another object of one embodiment of the present invention is to provide a semiconductor device with reduced power consumption, a semiconductor device capable of generating a signal (e.g., a potential signal or a current signal) suitable for usage environment or a purpose, a semiconductor device that can change or compensate the performance while being operated, or the like.

Note that other objects will be apparent from the description of the specification and the like, and other objects of embodiments of the present invention can be derived from the description of the specification and the like. One embodiment of the present invention does not necessarily achieve all the objects.

One embodiment of the present invention is a semiconductor device including a first memory circuit, a first circuit, and a second memory circuit. The first circuit converts a digital signal input from the first memory circuit into an analog signal. The first memory circuit includes an input node, an output node, a first transistor, and a first capacitor. The first capacitor is electrically connected to the output node. The first transistor controls a conduction state between the input node and the output node. The analog signal is input to the input node. A channel in the first transistor is formed using an oxide semiconductor.

In the above embodiment, a memory cell in the second memory circuit can include a transistor whose channel is formed using an oxide semiconductor.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are all semiconductor devices. Moreover, a memory device, a display device, a light-emitting device, a lighting device, an electronic device, and the like include a semiconductor device in some cases.

In this specification and the like, ordinal numbers such as first, second, and third are used to avoid confusion among components, and the terms do not limit the components numerically.

Note that "voltage" indicates a difference between potentials of two points, and "potential" indicates electrostatic energy (electrical potential energy) of a unit charge at a given point in an electrostatic field. In general, a difference between a potential of one point and a reference potential is merely called a potential or a voltage, and a potential and a voltage are used as synonymous words in many cases. Therefore, in this specification and the like, a potential may be rephrased as a voltage and a voltage may be rephrased as a potential unless otherwise specified.

A transistor includes three nodes (terminals) called a gate, a source, and a drain. A gate is a node that controls the conduction state of a transistor. Depending on the channel type of the transistor or levels of potentials applied to the terminals, one of nodes (an input node and an output node) functions as a source and the other functions as a drain. In general, in an n-channel transistor, a node to which a low potential is applied is referred to as a source, and a node to which a high potential is applied is referred to as a drain. In contrast, in a p-channel transistor, a node to which a low potential is applied is referred to as a drain, and a node to which a high potential is applied is referred to as a source.

In this specification and the like, to clarify a circuit configuration and circuit operation, one of two nodes (an input node and an output node) of a transistor is fixed as a source and the other is fixed as a drain in some cases. It is needless to say that, depending on a driving method, the magnitude relationship between potentials applied to three terminals of the transistor might be changed, and the source and the drain might be interchanged. Thus, in one embodiment of the present invention, the distinction between the source and drain of the transistor is not limited to that described in this specification and the like.

Note that an explicit description "X and Y are connected" indicates the case where X and Y are electrically connected, the case where X and Y are functionally connected, and the case where X and Y are directly connected. Here, each of X and Y denotes an object (e.g., a device, an element, a circuit, a wiring, an electrode, a terminal, a conductive film, or a layer). Accordingly, a connection relationship other than those shown in drawings and texts is also included without limitation to a predetermined connection relationship, for example, the connection relationship shown in the drawings and the texts.

Note that the term "electrical connection" includes a circuit configuration in which current, voltage, or a potential can be supplied or transmitted. Accordingly, the expression "two components are connected" means not only a circuit configuration in which the two components are directly connected but also a circuit configuration in which the two components are electrically connected through an element such as a wiring, a resistor, a diode, or a transistor so that current, voltage, or a potential can be supplied or transmitted.

Even when independent components are connected in a circuit diagram, there is the case where one conductive film has functions of a plurality of components, such as the case where part of a wiring functions as an electrode. The term "connection" in this specification and the like also means such a case where one conductive film has functions of a plurality of components.

Here, a voltage, a transistor, and the like are described, and description about others in this specification and the like is added in Embodiment 5.

A novel semiconductor device or a novel method of driving or manufacturing the semiconductor device can be provided. For example, a novel semiconductor device including an OS transistor, a novel method of driving or manufacturing the semiconductor device including an OS transistor can be provided. A semiconductor device with reduced power consumption, a semiconductor device capable of generating a signal (e.g., a potential signal or a current signal) suitable for usage environment or a purpose, a semiconductor device that can change or compensate the performance while being operated, or the like can be provided.

Note that the description of these effects does not disturb the existence of other effects. In one embodiment of the present invention, there is no need to achieve all the effects described above. In one embodiment of the present invention, an object other than the above objects, an effect other than the above effects, and a novel feature will be apparent from the description of the specification and the drawings.

DETAILED DESCRIPTION OF THE INVENTION

Figure 1:
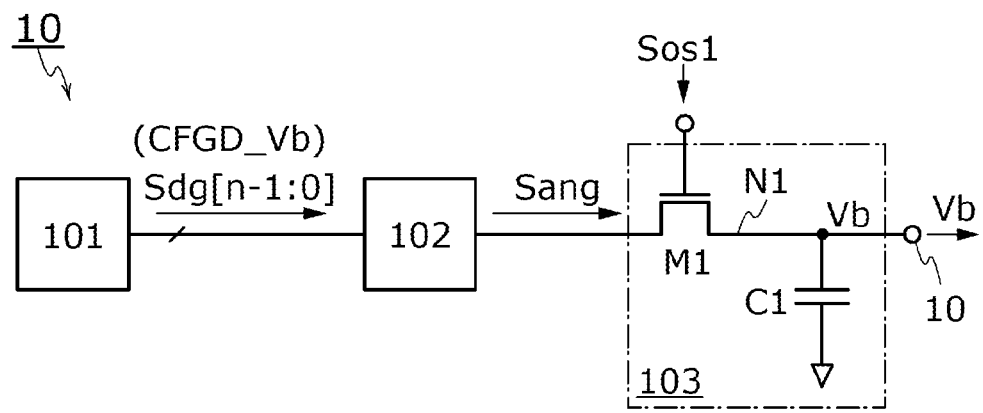
FIG. 1 is a block diagram illustrating a circuit configuration.

Embodiments of the present invention will be described below. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

In the drawings, the same components, components having similar functions, components formed of the same material, or components formed at the same time are denoted by the same reference numerals in some cases, and description thereof is not repeated in some cases. When the same reference numerals need to be distinguished from each other, "1", "2", "[n]", "[m, n]", or the like may be added to the reference numerals. For example, when a plurality of wirings WWL in a memory cell array is identified, address number (line number) of the memory cell array is used. Specifically, the wiring WWL in the second row is referred to as wiring WWL[2].

In this specification and the like, for example, clock signal CLK is abbreviated to "a signal CLK", "CLK", or the like in some cases. The same applies to other components (e.g., signal, voltage, potential, circuit, element, electrode, and wiring).

A plurality of embodiments of the present invention is described below, and any of the embodiments can be combined as appropriate. In addition, in the case where some structural examples are given in one embodiment, any of the structure examples can be combined as appropriate.

Embodiment 1

In this embodiment, a semiconductor device that can be programmed by a user after shipment is described as an example of a semiconductor device. In addition, a semiconductor device whose performance can be changed or compensated when being operated, i.e., a dynamically reconfigurable semiconductor device, is described.

<<Circuit 10: Potential Generating Circuit>>

FIG. 1 illustrates an example of a semiconductor device. A circuit 10 illustrated in FIG. 1 has a function of generating a potential, and thus can be a potential generating circuit. The circuit 10 includes a memory device 101, a digital-to-analog converter circuit (DAC) 102, and a circuit 103.

<Circuit 103>

The circuit 103 includes a transistor M1, a capacitor C1, and a node N1. The node N1 is electrically connected to an output node OUT10 of the circuit 10. One of a source and a drain of the transistor M1 is electrically connected to an output node of the memory device 101, and the other is electrically connected to the node N1. A potential Vb of the node N1 is supplied to another circuit as a power supply potential, a reference potential, a bias potential, or the like.

A signal Sos1 is input to a gate of the transistor M1. One of a pair of electrodes (terminals) of the capacitor C1 is electrically connected to the node N1, and the other is electrically connected to a wiring (not shown) supplied with a potential or a signal. For example, a potential of the wiring can be the ground potential or 0 V.

The capacitor C1 is charged and discharged by a current between the source and the drain (referred to as a drain current) of the transistor M1. The capacitor C1 functions as a storage capacitor holding the potential Vb of the node N1. That is, the circuit 103 can function as a sample-and-hold circuit. Alternatively, the circuit 103 can function as an analog memory circuit that stores the potential Vb of the node N1 as an analog value. To hold data in the circuit 103 for a long period, it is preferable that drain current in an off state (off-state current) of the transistor M1 be extremely low. Fluctuations of the potential Vb of the node N1 can be suppressed as the off-state current of the transistor M1 is lower.

To achieve a transistor with an extremely low off-state current, a semiconductor layer in the transistor may include a channel formation region having a band gap of greater than or equal to 2.5 eV and a carrier concentration of less than or equal to $1 \times 10^{14}$ cm$^{-3}$. A semiconductor layer having such characteristics is, for example, an oxide semiconductor layer. It is very effective to use an OS transistor as the transistor M1 because the number of rewriting operations of the potential of the node N1 can be reduced. In the OS transistor, a normalized off-state current per micrometer of a channel width at a source-drain voltage of 10 V at the room temperature (approximately 25° C.) can be less than or equal to $10 \times 10^{-21}$ A (10 zA (zeptoampere)).

The off-state current of the OS transistor in high temperature environment (100° C. or higher) is maintained to approximately the same as the off-state current at the room temperature. For this reason, with the use of an OS transistor as the transistor M1, the amount of change in the potential Vb of the node N1 in the high temperature environment can be approximately the same as the amount of change at the room temperature.

In an OS transistor used in a semiconductor device of one embodiment of the present invention (for example, the circuit 10), an oxide semiconductor layer including a channel formation region may be formed of a single oxide semiconductor film or two or more oxide semiconductor films. The oxide semiconductor film included in the oxide semiconductor layer is preferably formed with an oxide semiconductor containing at least one element selected from In, Ga, Sn, and Zn. As such an oxide, an In—Sn—Ga—Zn oxide, an In—Ga— Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, a Zn oxide, or the like can be used. Furthermore, any of the above oxides may contain an element other than In, Ga, Sn, and Zn, for example, SiO$_2$.

(Operation Example)

The memory device 101 stores configuration data (CFGD_Vb) that determines a value of Vb. The configuration data CFGD_Vb is digital data of n bits (n is a natural number). When the potential Vb of the node N1 is determined, the memory device 101 is required to read CFGD_Vb. The memory device 101 outputs CFGD_Vb to the DAC 102 as a n-bit digital signal Sdg[n-1:0]. The DAC 102 converts Sdg[n-1:0] into an analog signal Sang and outputs the converted signal. The signal Sang is an analog potential signal that corresponds to the value of Sdg[n-1:0].

The potential of the gate of the transistor M1 is controlled by the signal Sos1 to turn on the transistor M1. Thus, an output node of the DAC 102 is electrically connected to the node N1. The potential Vb of the node N1 is in accordance with the potential of Sang. After that, when the transistor M1 is turned off, the node N1 is electrically floating and the circuit 103 maintains the potential Vb.

<Memory Device 101>

Figure 2:
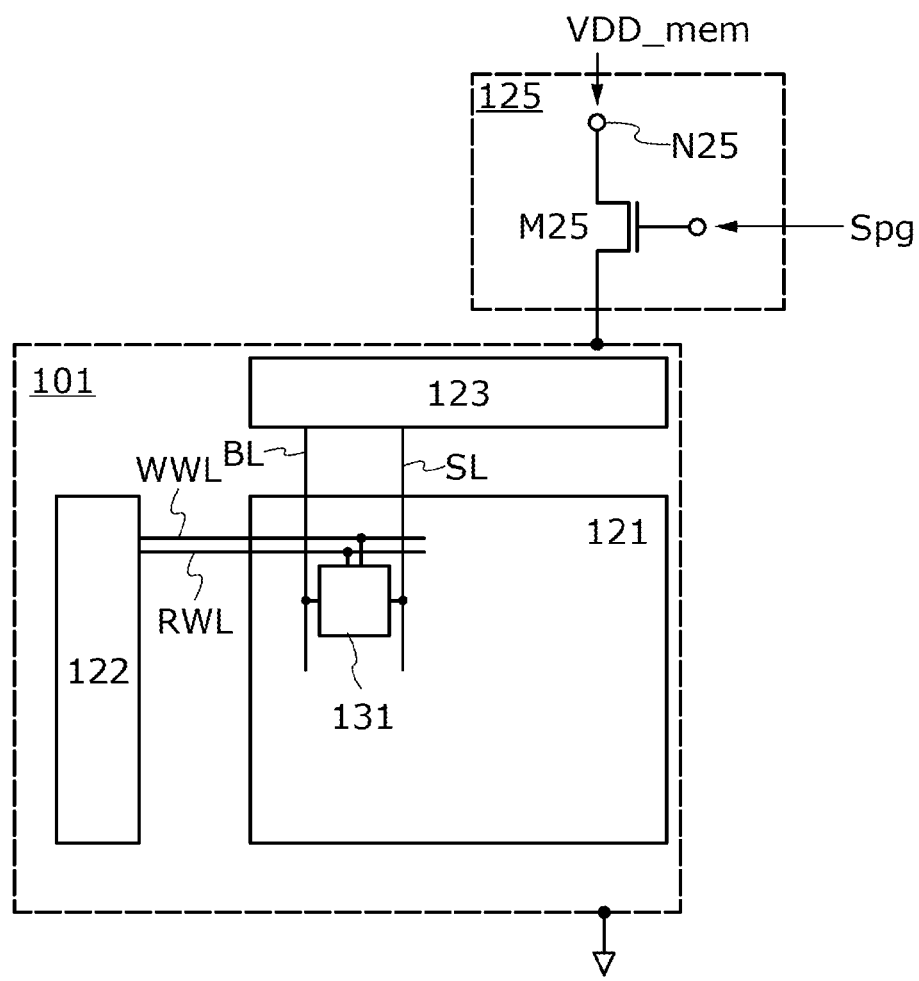
FIG. 2 is a block diagram illustrating an example of a memory device configuration.

FIG. 2 is a block diagram illustrating a configuration example of the memory device 101. As illustrated in FIG. 2, the memory device 101 includes a memory cell array 121, a row driver 122, and a column driver 123. A circuit 125 is electrically connected to the memory device 101.

The circuit 125 can function as a power gating circuit of the memory device 101. The circuit 125 includes a transistor M25 and a node N25. The node N25 is a power supply node to which a power supply potential of the memory device 101 is input. For example, a high power supply potential VDD_mem of the memory device 101 is input to the node N25. A signal Spg is input to a gate of the transistor M25. One of a source and a drain of the transistor M25 is electrically connected to the node N25, and the other is electrically connected to the power supply node in the memory device 101 to which the VDD_mem is input. The power supply of the memory device 101 can be stopped by turning off the transistor M25 by controlling the potential of the signal Spg. The transistor M25 may be either an n-channel transistor or a p-channel transistor.

The memory cell array 121 includes a plurality of memory cells 131 and a plurality of wirings (WWL, RWL, BL, and SL). The row driver 122 drives the wirings WWL and RWL. The column driver 123 drives the wirings BL and SL. The column driver 123 includes a reading circuit. The wiring BL is also driven by the memory cell 131 selected by reading operation.

The memory device 101 can be a semiconductor memory device with small storage capacity as long as it stores at least the configuration data CFGD_Vb. When the memory device 101 has small storage capacity, a control circuit of the semiconductor device including the circuit 10 may serve as the row driver 122 and the column driver 123. Alternatively, a semiconductor memory device in the semiconductor device including the circuit 10 may store the configuration data CFGD_Vb, without providing the memory device 101 in the circuit 10. In that case, the semiconductor memory device that stores CFGD_Vb preferably has a structure similar to that of the memory device 101.

<Memory Cell>

Figure 3A:
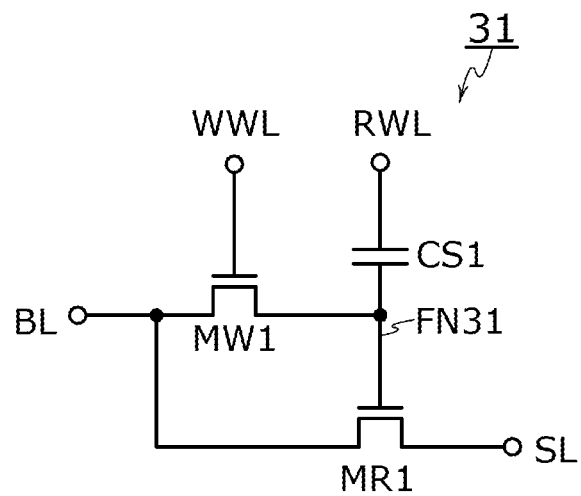
FIGS. 3A and 3B are each a circuit diagram illustrating an example of a memory cell configuration.
Figure 3B:
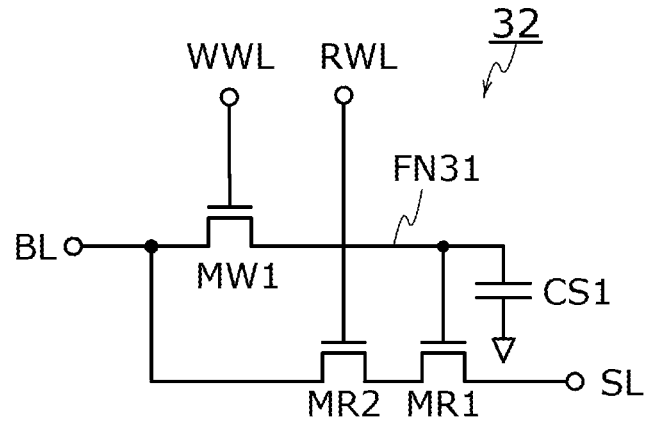

For example, a gain cell including two or three transistors can be used as the memory cell 131 in the memory cell array 121. FIGS. 3A and 3B each illustrate a configuration example of a memory cell that can be used as the memory cell 131. FIG. 3A illustrates an example of a 2T-type gain cell, and FIG. 3B illustrates an example of a 3T-type gain cell.

As illustrated in FIG. 3A, a memory cell 31 includes a transistor MW1, a transistor MR1, a capacitor CS1, and a node FN31.

The node FN31 functions as a data holding node. A gate of the transistor MW1 is electrically connected to the wiring WWL, one of a source and a drain of the transistor MW1 is electrically connected to the wiring BL, and the other is electrically connected to the node FN31. The transistor MW1 functions as a writing transistor and as a switch that controls conduction between the data holding node (FN31) and the wiring (BL) to which data to be written is input. A gate of the transistor MR1 is electrically connected to the node FN31, one of a source and a drain of the transistor MR1 is electrically connected to the wiring BL, and the other is electrically connected to the wiring SL. The transistor MR1 functions as a reading transistor. The transistor MR1 amplifies electric charge accumulated in the node FN31 and outputs it as drain current. One of a pair of electrodes (terminals) of the capacitor CS1 is electrically connected to the wiring RWL, and the other is electrically connected to the node FN31. The capacitor CS1 functions as a storage capacitor that holds a potential of the node FN31. The node FN31 is capacitively coupled to the wiring RWL by the capacitor CS1.

During data writing, the transistor MW1 is turned on by the potential of the wiring WWL, and the potential of the wiring BL is written to the node FN31. The potential of the wiring RWL and/or the wiring SL are/is adjusted not to turn on the transistor MR1. During data holding, the transistor MW1 is turned off and the node FN31 is electrically floating. The node FN31 functions as a data holding node. During data reading, the transistor MW1 is kept off by the potential of the wiring WWL. The wiring BL is precharged to have a predetermined potential, and then electrically floating. The potential of the wiring RWL and/or the wiring SL are/is adjusted to increase or decrease the potential of the node FN31. The potential of the node FN31 is increased in the case where the transistor MR1 is an n-channel transistor and decreased in the case where the transistor MR1 is a p-channel transistor. The drain current flowing through the transistor MR1 increases or decreases the potential of the wiring BL. When the transistor MR1 is kept off, the potential of the wiring BL is not changed. In the reading circuit in the column driver 123, the potential of the wiring BL is detected.

To suppress a decrease in the potential of the node FN31 as possible in a data holding period, it is preferable that the transistor MW1 have an extremely low off-state current as well as the transistor M1 of the circuit 103. That is, the transistor MW1 is preferably an OS transistor as well as the transistor M1. With the use of an OS transistor as the transistor MW1, when power supply potential VDD_mem is interrupted by power gating by the circuit 125 or the like, the node FN31 is electrically floating; however, change in the potential of the node FN31 can be suppressed even in a period when supply of the power supply potential VDD_mem is stopped. Therefore, the memory device 101 can be operated as a nonvolatile semiconductor memory device. With the use of an OS transistor as the transistor MR1, change in the potential of the node FN31 in high temperature environment (100° C. or higher) can be as low as change in the potential of the node FN31 at the room temperature.

A 3T-type gain cell has a circuit configuration in which a reading transistor is added to a 2T-type gain cell. As illustrated in FIG. 3B, the memory cell 32 is a memory circuit in which a transistor MR2 is added to the memory cell 31. In the 3T-type gain cell, the capacitor CS1 is not necessarily provided in some cases because a gate capacitance of the transistor MR1 can function as a storage capacitor of the node FN31. Providing the capacitor CS1 can prolong the data holding period.

A gate of the transistor MR2 is electrically connected to the wiring RWL, one of a source and a drain of the transistor MR2 is electrically connected to the wiring BL, and the other is electrically connected to the source or the drain of the transistor MR1. The transistor MR2 functions as a switch that controls conduction between the transistor MR1 and the wiring BL. The operation of the memory cell 32 is similar to that of the memory cell 31. During writing operation, a potential of the wiring RWL makes the transistor MR2 off. During reading operation, a potential of the wiring RWL makes the transistor MR2 on and electrically connects the wiring BL and a source or a drain of the transistor MR1.

In the memory cells 31 and 32, the wiring BL is used as a bit line for writing and reading, but a bit line for writing and a bit line for reading may be separately provided. In such a case, when the wiring BL is used as the bit line for writing, a line used as the bit line for reading is provided to be electrically connected to the transistor MR1 in the memory cell 31, and to be electrically connected to the transistor MR2 in the memory cell 32.

<DAC 102>

Figure 4:
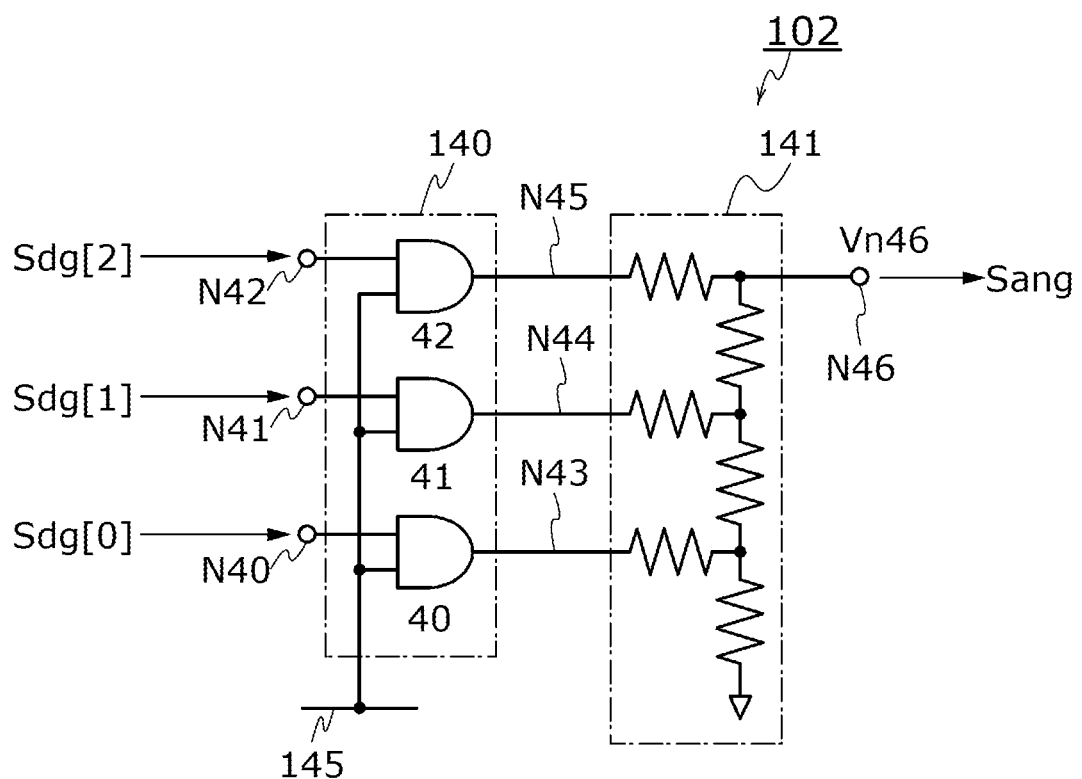
FIG. 4 is a circuit diagram illustrating an example of an analog-to-digital converter circuit.

FIG. 4 is a circuit diagram of the DAC 102, which is an example of a 3-bit input DAC.

The DAC 102 includes a circuit 140 and a circuit 141. Nodes N40 to N42 are input nodes of a digital signal Sdg[2:0]. Nodes N43 to N45 are output nodes of the circuit 140. The circuit 140 is a combinational circuit having a logical operation function. In the example of FIG. 4, the circuit 140 includes three AND gate circuits 40 to 42. Input nodes of the AND gate circuits 40 to 42 are electrically connected to the wiring 145. The circuit 141 is a ladder resistance circuit and functions as a DA converter portion. An output node N46 of the circuit 141 is electrically connected to an input node of the circuit 103.

To convert Sdg[2:0] into an analog signal, logical value 1 is input to the wiring 145 so that the same logical values of the nodes N40 to N42 are output from the nodes N43 to N45. A digital value of 3 bits corresponding to logical values of the nodes N43 to N45 is converted into an analog value in the circuit 141. Specifically, an analog potential Vn46 of the output node N46 of the circuit 141 corresponds to an analog value. The analog potential Vn46 of the node N46 is input to the circuit 103 as an analog signal (a potential signal) Sang.

In the circuit 103, the analog potential Vn46 that is output to the node N46 is stored in the node N1 via the transistor M1. Specifically, the transistor M1 is kept on for a predetermined period, a signal Sang is sampled, and then the transistor M1 is turned off. The node N1 is electrically floating, and its potential Vb is a potential corresponding to the analog potential Vn46.

In the DAC 102, by setting the potential of the wiring 145 to a potential corresponding to logical value 0, potentials of the nodes N43 to N45 can be reset to potentials corresponding to the logical value 0. In that case, the analog potential Vn46 becomes low power supply potential (for example, 0 V) of the circuit 10. Therefore, output of the potential Vb from the circuit 10 can be stopped by controlling the potential of the wiring 145. Note that in the case where potentials of the nodes N40 to N42 correspond to the logical value 0 by stopping power supply of the memory device 101, the circuit 140 and the wiring 145 can be omitted.

The memory cell 31 illustrated in FIG. 3A and the memory cell 32 illustrated in FIG. 3B are gain cells in which data is stored in the node FN31. The memory cell 31 and the memory cell 32 do not deteriorate in principle; thus, the number of rewriting operations to the memory device 101 is not limited in principle. Therefore, there is no need to store a large number of CFGD_Vb sets in the memory device 101 before shipment because CFGD_Vb stored in the memory device 101 can be rewritten as appropriate after the circuit 10 is formed. Accordingly, the minimum capacitance of the memory device 101 is the number of bits of digital data output to the DAC 102. Since the number of rewriting operations to the memory device 101 is not limited, CFGD_Vb data can be rewritten any time after shipment. For example, CFGD_Vb data can be refreshed while the circuit 10 is being operated. That is, the circuit 10 can be a dynamically reconfigurable analog circuit whose performance, characteristics, functions, and the like can be dynamically changed. By providing the circuit 10 in the semiconductor device, optimum potential Vb can be generated constantly in response to usage environment, characteristic deterioration, and characteristic variations due to manufacturing processes.

The potential Vb output from the circuit 10 can be held at the node N1 of the circuit 103 for a long period. After the potential of the node N1 becomes a suitable value, power supply to the memory device 101 and the DAC 102 can be stopped; thus, power consumption of the circuit 10 can be reduced.

The circuit 10 can respond to variations due to manufacturing processes and generate an optimum potential for usage environment or a purpose. The use of the circuit 10 as a potential generating circuit can improve the performance and reliability of the semiconductor device, and can widen a temperature range where the semiconductor device can be used. An example of a structure of the semiconductor device including the circuit 10 is described below.

<<Sensor Unit>>

Figure 5A:
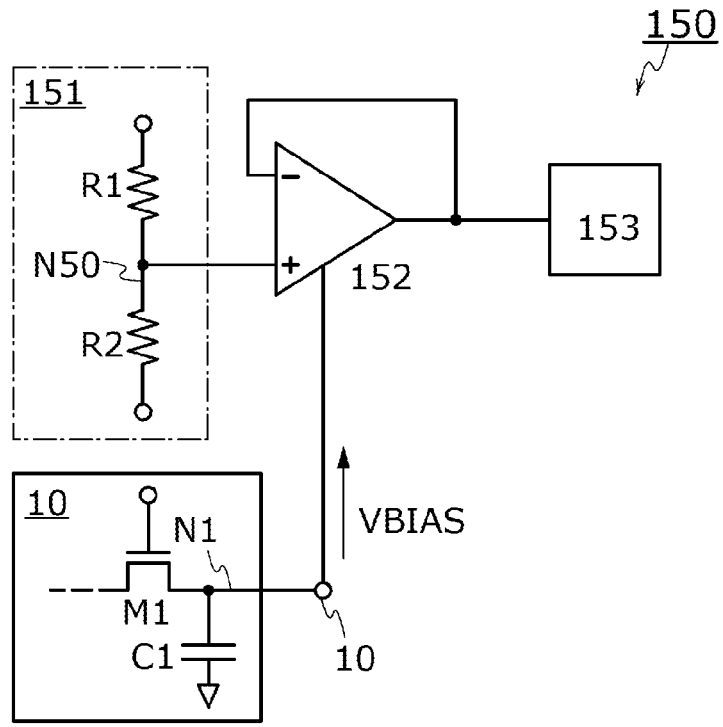
FIG. 5A is a block diagram illustrating an example of a sensor unit.

FIG. 5A illustrates an example of a sensor unit. The sensor unit 150 includes the circuit 10, a sensor circuit 151, an operational amplifier (AMP) 152, and an analog-to-digital converter circuit (ADC) 153. The sensor circuit 151 has a function of converting detected data into an analog signal (a current signal or a potential signal) and outputting the analog signal. The AMP 152 amplifies a signal output from the sensor circuit 151 and outputs the amplified signal. The ADC 153 converts the signal (an analog signal) output from the AMP 152 into a digital signal. The ADC 153 is provided if necessary.

<Sensor Circuit>

There is no particular limitation on the sensor circuit 151. A circuit having a function of measuring or sensing force, displacement, position, speed, acceleration, angular velocity, rotational frequency, distance, light (e.g., visible light or infrared light), liquid, magnetism, temperature, chemical substance, sound, time, hardness, electric field, electric current, voltage, electric power, radiation, flow rate, humidity, gradient, oscillation, odor, or the like is used as the sensor circuit 151. FIG. 5A illustrates an example where the sensor circuit 151 functions as a temperature sensor circuit.

The sensor circuit 151 includes a resistor R1 and a resistor R2 which are electrically connected in series. A node N50 at which the resistor R1 and the resistor R2 are connected is an output node of the sensor circuit 151. The resistor R1 and the resistor R2 have different temperature characteristics, for example, one is a conductor and the other is a semiconductor. A reference potential is applied to both terminals of the series-connected resistors R1 and R2. The resistance values of the resistor R1 and the resistor R2 change depending on temperature, which changes the potential of the node N50. The node N50 is electrically connected to a non-inverting input node (+) of the AMP 152. The potential of the node N50 is amplified by the AMP 152.

<Operational Amplifier>

Figure 5B:
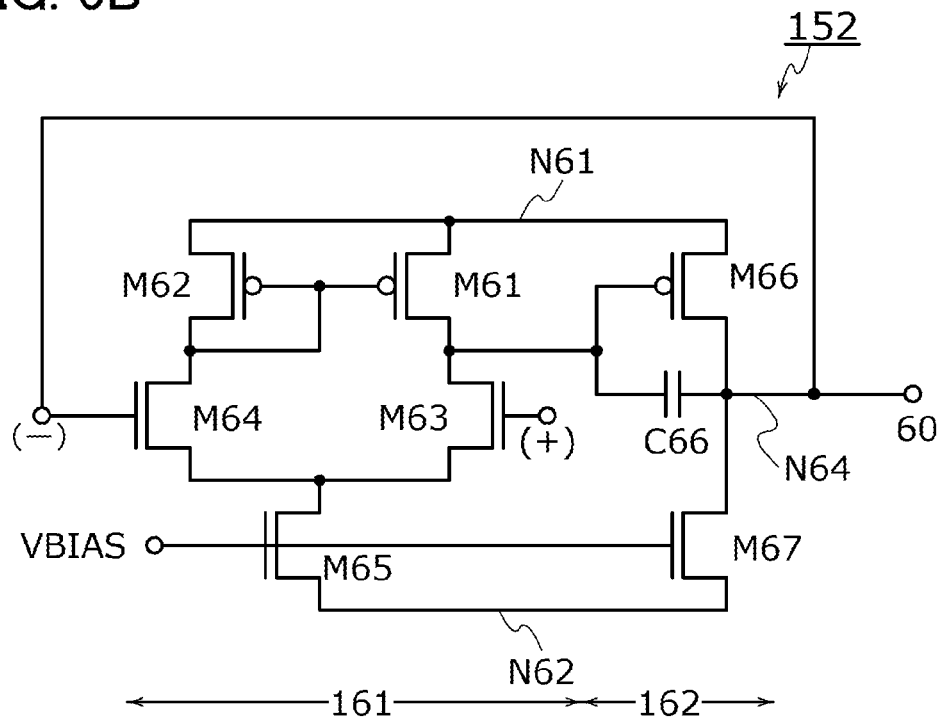
FIG. 5B is a circuit diagram illustrating an example of an operational amplifier.

In the sensor unit 150, the circuit 10 has a function of generating a bias potential (VBIAS) of the AMP 152, as illustrated in FIG. 5A. The potential Vb of the output node OUT10 of the circuit 10 corresponds to the VBIAS. FIG. 5B is a circuit diagram illustrating an example of the AMP 152.

In the AMP 152, as illustrated in FIG. 5B, a differential amplifier circuit 161 including transistors M61 to M65 is provided in an input stage, and a common source amplifier circuit 162 including transistors M66 and M67 and a capacitor C66 is provided in an output stage. The capacitor C66 functions as a phase compensation capacitor that prevents oscillation of the AMP 152.

A node N61 is a power supply node to which high power supply potential is input, and a node N62 is a power supply node to which low power supply potential is input. A gate of the transistor M63 becomes a non-inverting input node (+), and a gate of the transistor M64 becomes an inverting input node (−). A connection portion (a node N64) between the transistor M66 and the transistor M67 is electrically connected to an output node OUT60 of the AMP 152. The inverting input node (−) is electrically connected to the node OUT60, and negatively fed back.

The transistor M65 functions as a current source of the differential amplifier circuit 161, and the transistor M67 functions as a current source of the common source amplifier circuit 162. Gates of the transistor M65 and the transistor M67 are connected to the output node OUT10 of the circuit 10, and the bias potential VBIAS is input thereto. The transistor M65 and the transistor M67 are preferably OS transistors. An OS transistor has a thicker gate insulating layer than a Si transistor; thus, gate leakage current of the OS transistor can be much smaller than that of the Si transistor. With the use of an OS transistor as the transistor M1, the potential of the node N1 in the circuit 10 can be held for an extremely long period when the transistor M1 is off. This can reduce power consumption of the sensor unit 150.

In the sensor unit 150, in the case where the capacitor C1 of the circuit 10 has small capacitance, when the potential of the node N64 changes, the potential of the node N1 might be changed by coupling capacitance such as capacitance (gate capacitance) between the gate and a source of the transistor M67 despite an extremely low off-state current of the transistor M1. Therefore, the capacitance of the capacitor C1 is preferably large to some extent as long as parasitic capacitance (e.g., gate capacitance of the transistor M67) of the node N1 is negligible.

In the sensor unit 150, the bias potential VBIAS of the AMP 152 can be adjusted as appropriate by the circuit 10; accordingly, performance or characteristics of the sensor unit 150 can be changed or compensated while the sensor unit 150 is being operated. For this reason, the sensor unit 150 can be said to be a dynamic reconfigurable analog circuit.

<<Wireless Tag>>

Figure 6:
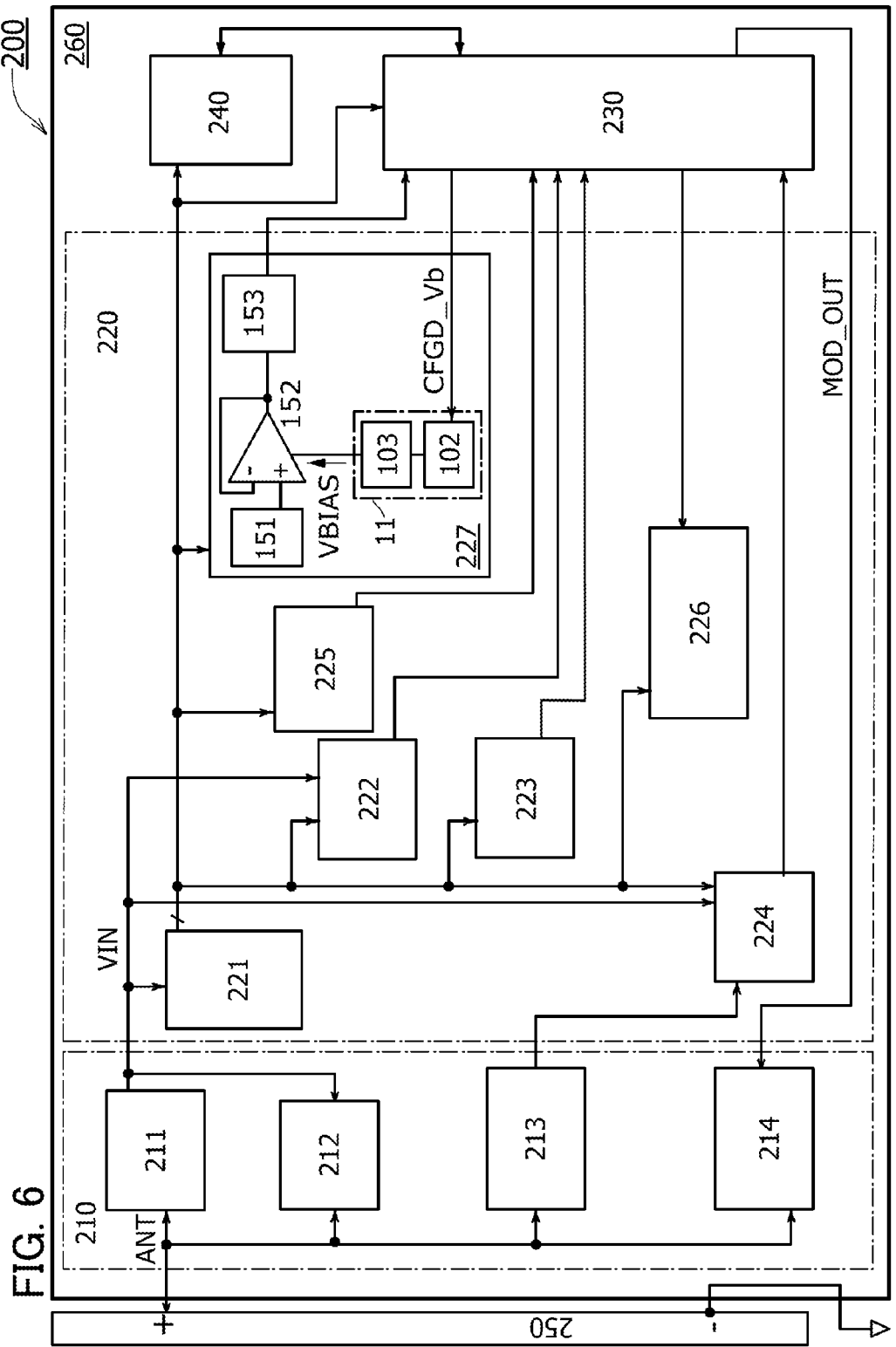
FIG. 6 is a block diagram illustrating an example of a wireless tag.

Here, a wireless tag including a sensor unit is described as an example of a semiconductor device. FIG. 6 is a block diagram illustrating an example of a wireless tag. Note that the wireless tag is referred to as an RFID tag, an RFID, an RF tag, an ID tag, an IC tag, an IC chip, an electronic tag, a wireless IC tag, and the like.

FIG. 6 is a block diagram illustrating a configuration example of a wireless tag. A wireless tag 200 illustrated in FIG. 6 is a passive wireless tag whose communications zone is a UHF band. The wireless tag 200 can be an active wireless tag with a built-in battery. The communications zone can be determined as appropriate depending on usage of the wireless tag 200.

As illustrated in FIG. 6, the wireless tag 200 includes an antenna 250 and a circuit portion 260. The circuit portion 260 has a function of processing a signal received by the antenna 250, a function of generating response data in accordance with the received signal, a function of outputting the response data as a carrier wave from the antenna 250, and the like. The circuit portion 260 is integrated in one IC chip, and is an electronic component called a wireless chip, an RF chip, or the like. As illustrated in FIG. 6, the circuit portion 260 includes an input/output portion (IN/OUT) 210, an analog portion 220, a logic portion 230, and a memory portion 240, for example.

<<Logic Portion>>

The logic portion 230 controls the circuit portion 260. The logic portion 230 includes, for example, a control circuit, a clock generation circuit, a decoder circuit, a CRC circuit, a random number generating circuit, an output signal generation circuit, a register, and the like.

The control circuit controls the circuit portion 260. For example, the control circuit controls access and transmission to the memory portion 240. The decoder circuit decodes a signal output from a buffer circuit 224. The CRC circuit is a circuit that calculates a cyclic redundancy check (CRC) code from an input signal from the decoder circuit. The output signal generation circuit is a circuit that generates a signal MOD_OUT.

<<Memory Portion>>

A semiconductor memory device with a structure similar to that of the memory device 101 is used for the memory portion 240. Thus, the memory portion 240 can substantially function as a nonvolatile memory device, and data can be held in the memory portion 240 even when the wireless tag 200 cannot receive a signal.

<Input/Output Portion>

The input/output portion 210 includes a rectifier circuit 211, a limiter circuit 212, a demodulation circuit 213, and a modulation circuit 214.

The rectifier circuit 211 is a circuit that rectifies a signal (a carrier wave ANT) input from the antenna 250 and generates a potential VIN. The potential VIN is used as electromotive force of the circuits (the analog portion 220, the logic portion 230, and the memory portion 240). The limiter circuit 212 is a protection circuit for preventing the potential VIN from becoming high. The demodulation circuit 213 is a circuit that demodulates the carrier wave ANT received by the antenna 250. The carrier wave ANT demodulated by the demodulation circuit 213 is output from the input/output portion 210.

The modulation circuit 214 is a circuit that superimposes the signal MOD_OUT (digital signal) transmitted from the logic portion 230 on the carrier wave ANT. For example, in the case of an amplitude shift keying (ASK) modulation method, the carrier wave ANT is modulated in the modulation circuit 214 in accordance with the signal MOD_OUT transmitted from the logic portion 230, and the modulated wave is transmitted from the antenna 250.

<Analog Portion>

The analog portion 220 includes a power supply circuit 221, a detector circuit 222, a reset circuit 223, a buffer circuit 224, an oscillator circuit 225, a flag holding circuit 226, and a sensor unit 227. The analog portion 220 is an analog signal processing circuit and has a function of generating an operation potential of the circuits (the analog portion 220, the logic portion 230, and the memory portion 240), a function of generating a clock signal, a function of converting a received signal into a digital signal and transmitting the signal to the logic portion 230, and the like.

The power supply circuit 221 is a circuit that generates operation potentials of the circuits (the analog portion 220, the logic portion 230, and the memory portion 240). The power supply circuit 221 generates one operation potential or two or more operation potentials with different values. The detector circuit 222 has a function of determining whether the potential VIN is higher or lower than a predetermined value and generating a digital signal corresponding to the determination result. This digital signal output from the detector circuit 222 is used as a trigger signal for operating the logic portion 230. The reset circuit 223 monitors the voltage generated by the power supply circuit 221 and generates a reset signal that resets the logic portion 230.

The buffer circuit 224 is a circuit that transmits serial data demodulated and extracted by the demodulation circuit 213, to the logic portion 230. The oscillator circuit 225 is a circuit that generates a reference clock signal from the potential signal generated by the power supply circuit 221. The flag holding circuit 226 is a circuit that holds flag data. The flag is data that shows the state of the wireless tag 200. The flag state holding period is set by International Organization for Standardization.

(Sensor Unit)

The sensor unit 227 has a structure similar to that of the sensor unit 150 (FIG. 5A), and includes a circuit 11, the sensor circuit 151, the AMP 152, and the ADC 153. The circuit 11 is provided as a potential generating circuit, and generates bias potential VBIAS of the AMP 152. The circuit 11 includes the DAC 102 and the circuit 103, and has a circuit configuration in which the memory device 101 is excepted from the circuit configuration illustrated in FIG. 1. The memory portion 240 stores configuration data (CFGD_Vb) processed in the DAC 102. By control by the logic portion 230, CFGD_Vb is read out from the memory portion 240 to output to the DAC 102 of the sensor unit 227.

Data detected by the sensor unit 227 is transmitted to the logic portion 230. The logic portion 230 generates the signal MOD_OUT in accordance with a signal output from the sensor unit 227. The signal MOD_OUT is modulated by the modulation circuit 214 and transmitted from the antenna 250. When a reader/writer (not illustrated) receives a signal from the wireless tag 200, the reader/writer analyzes the signal. When the value of response speed or power consumption of the wireless tag 200 is not the optimum value, the reader/writer transmits a command to refresh CFGD_Vb. When the wireless tag 200 receives this command, the CFGD_Vb of the memory portion 240 is rewritten.

By the above-described communication between the wireless tag 200 and the reader/writer, CFGD_Vb stored in the wireless tag 200 can be updated to optimum data as appropriate. For this reason, the reader/writer stores a table of the optimum values of CFGD_Vb in accordance with usage environment and the like. The reader/writer processes a signal transmitted from the wireless tag 200, calculates the optimum value of the CFGD_Vb, and selects desirable data from the stored table. Thus, calculations for the optimum value of the CFGD_Vb and selection of the desirable value from plural data are not needed in the wireless tag 200. Specifically, there is no need to increase the processing speed (clock frequency) in the wireless tag 200 for the optimizing the performance of the sensor unit 227, which can suppress an increase in power consumption of the wireless tag 200. Thus, power overhead of the wireless tag 200 can be prevented even when the sensor unit 227 is incorporated; whereby a decrease in response speed of the wireless tag 200 or shortening of communication distance can be inhibited.

Figure 7A:
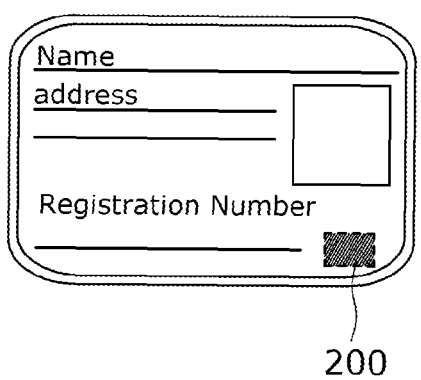
FIGS. 7A to 7F illustrate usage examples of a wireless tag.
Figure 7B:
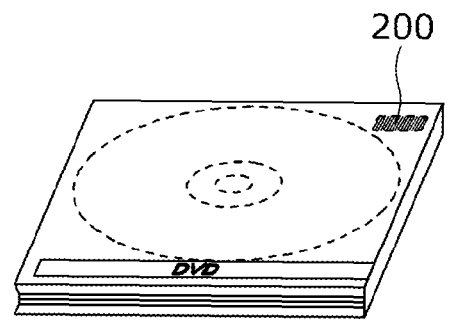
Figure 7C:
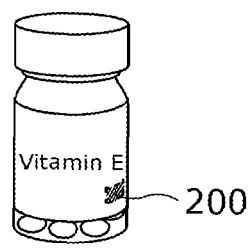
Figure 7D:
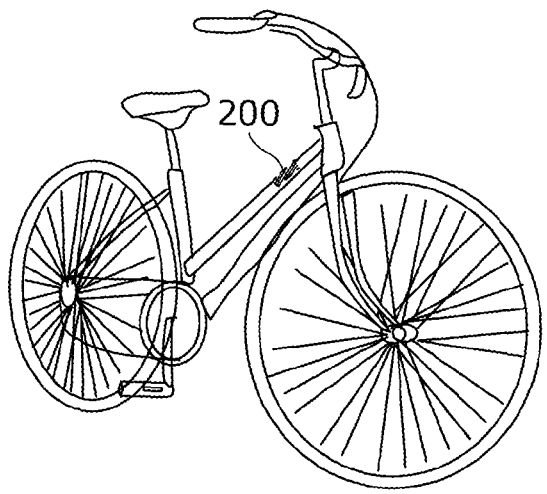
Figure 7E:
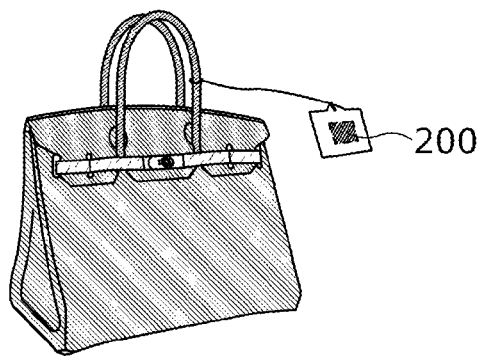
Figure 7F:
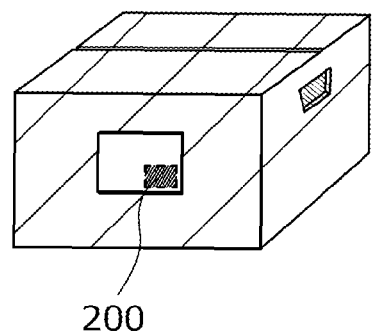

The wireless tag 200 can be used in a wide range of fields. For example, the wireless tag 200 can be provided in objects such as bills, coins, securities, bearer bonds, documents (e.g., driver's licenses or resident's cards, see FIG. 7A), packaging containers (e.g., wrapping paper or bottles, see FIG. 7C), recording media (e.g., DVDs, see FIG. 7B), vehicles (e.g., bicycles, see FIG. 7D), personal belongings (e.g., bags or glasses), foods, plants, animals, human bodies, clothing, household goods, medical supplies such as medicine and chemicals, and electronic devices (e.g., liquid crystal display devices, EL display devices, smartphones, cellular phones, clocks, or watches), or tags on objects (see FIGS. 7E and 7F).

The wireless tag 200 including a temperature sensor circuit and/or a humidity sensor circuit can be used for controlling temperature and/or humidity of the cultural properties, for example.

The wireless tag 200 is fixed to an object by being attached to a surface of the object or being embedded in the object. For example, the wireless tag 200 is fixed to an object by being embedded in paper of a book, or embedded in an organic resin of a package. Since the wireless tag 200 can be reduced in size, thickness, and weight, it can be fixed to an object without spoiling the design of the object. When the wireless tag 200 is provided in bills, coins, securities, bearer bonds, documents, or the like, an authentication function can be provided to the objects. The use of the authentication function can prevent forgery. Furthermore, when the wireless tag 200 is attached to packaging containers, recording media, personal belongings, foods, clothing, household goods, electronic devices, or the like, a system such as an inspection system or an inventory management system can be used efficiently. When the wireless tag 200 is attached to vehicles, the level of security can be raised.

The wireless tag 200 which uses an OS transistor in the memory portion 240 can hold data even in high-temperature environment; accordingly, an identity management system for an object that is exposed to high-temperature environment can be constructed. Examples of such an object include an object subjected to high-temperature sterilizing treatment (e.g., surgical instrument, dishes, cooking tools, experimental instrument, and clothing).

For example, the wireless tag 200 is attached to surgical instruments (e.g., steel items such as a scalpel, tweezers, and forceps). Identification information on the kind of the instrument, usage history information, information on cleaning and sterilization, or the like is written to the wireless tag 200 by a reader/writer. The wireless tag 200 which uses an OS transistor in the memory portion 240 does not lose its data through the sterilizing treatment by steam under high pressure for the surgical instrument. Thus, with the identity management system using the wireless tag 200, surgical instruments can be efficiently and appropriately managed and can be properly disposed of.

Embodiment 2

In this embodiment, a semiconductor device structure is described. As described in Embodiment 1, a semiconductor device can be formed with a Si transistor and an OS transistor. The semiconductor device with such a structure can be reduced in size by stacking a Si transistor and an OS transistor. A structural example of the semiconductor device with such a stacked structure is described with reference to FIG. 8 and FIG. 9.

Figure 8:
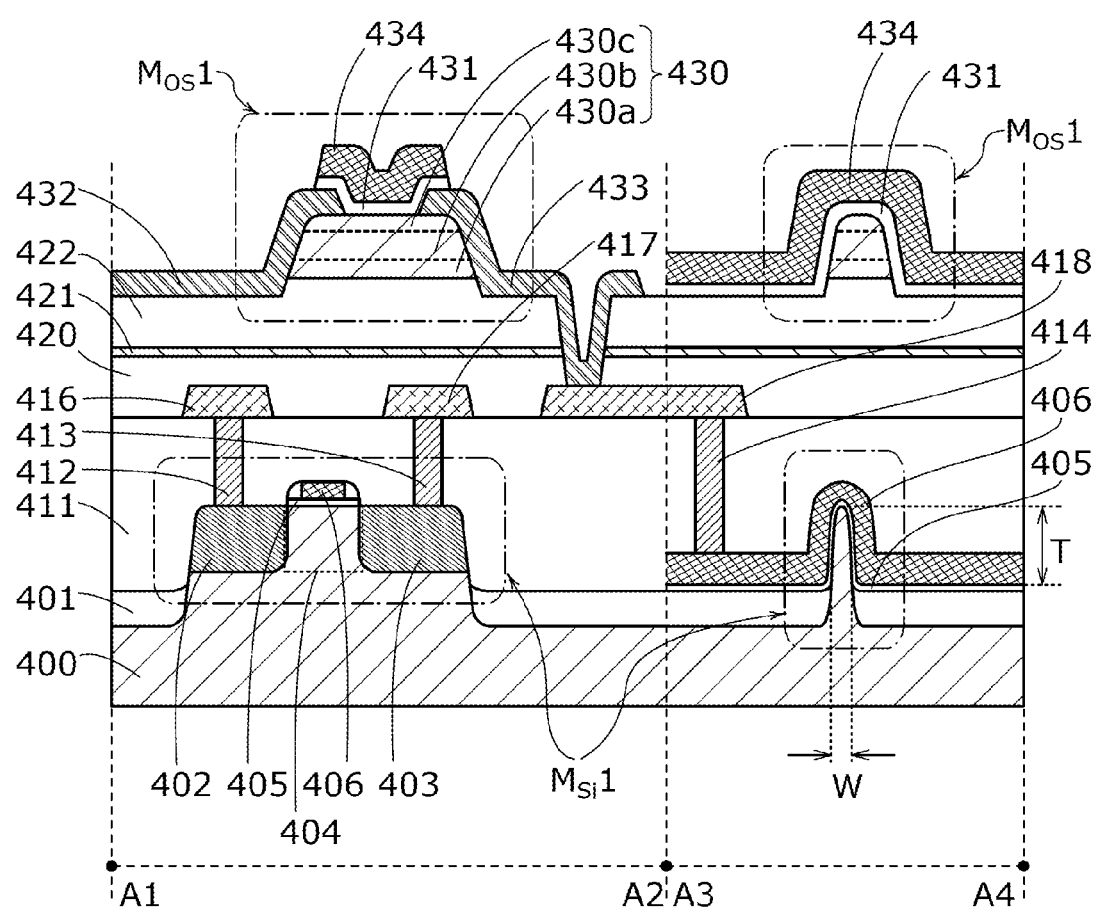
FIG. 8 is a cross-sectional view illustrating an example of a structure of a semiconductor device.
Figure 9:
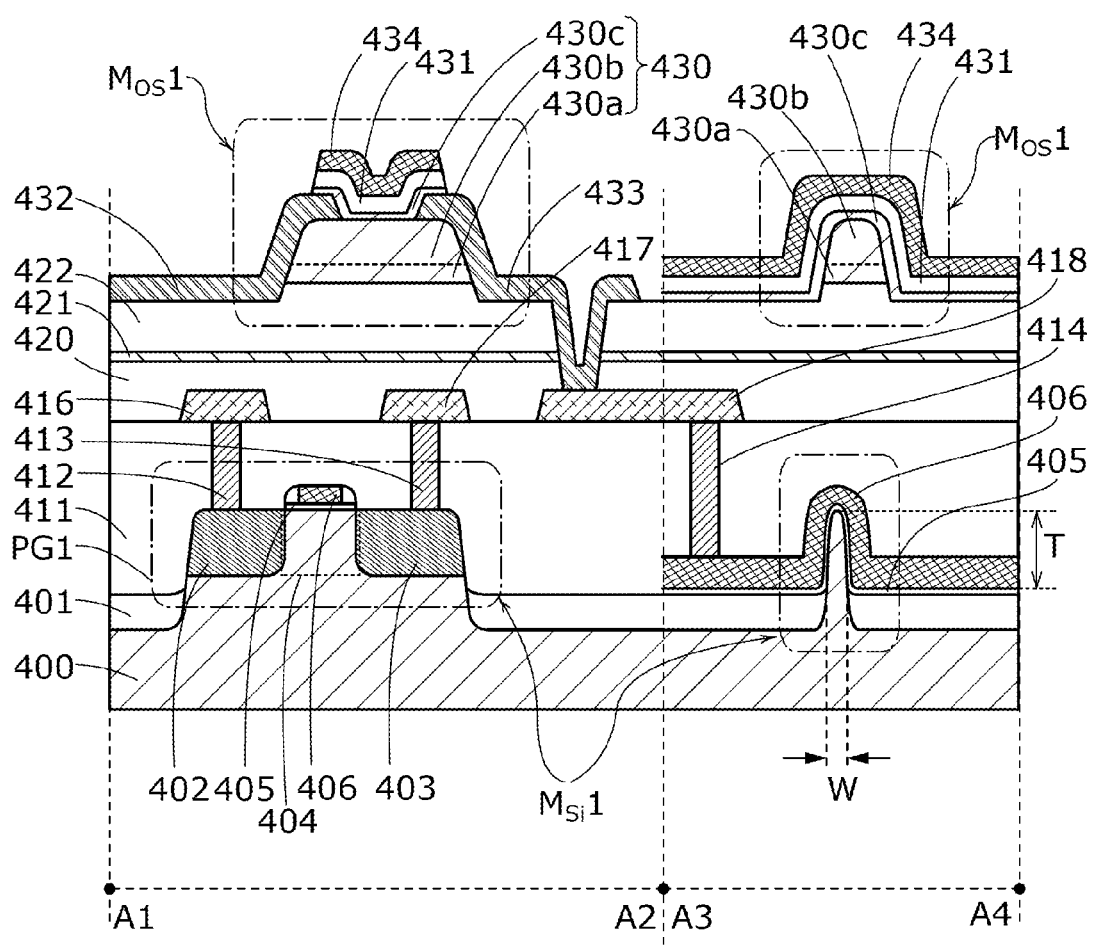
FIG. 9 is a cross-sectional view illustrating an example of a structure of a semiconductor device.

FIG. 8 illustrates part of a cross-sectional structure of the semiconductor device. In FIG. 8, a transistor $M_{OS}1$ and a transistor $M_{Si}1$ in a semiconductor device are illustrated. In FIG. 8, the transistor $M_{OS}1$ is an OS transistor in which a channel formation region is formed in an oxide semiconductor layer, and the transistor $M_{Si}1$ is a Si transistor in which a channel formation region is formed in a single crystal silicon substrate. The transistor $M_{OS}1$ is formed over the transistor $M_{Si}1$. For example, in the circuit 10, the sensor unit 150, and the wireless tag 200, the transistor M1 and the transistor MR1 may be the transistors $M_{OS}1$ and the other transistors may be the transistors $M_{Si}1$.

Note that the cross-sectional structures of the transistors $M_{OS}1$ and $M_{Si}1$ in a channel length direction are shown in a section indicated by broken line A1-A2, and the cross-sectional structures of the transistors $M_{OS}1$ and $M_{Si}1$ in a channel width direction are shown in a section indicated by broken line A3-A4. In an actual semiconductor device, the channel length direction of the transistor $M_{OS}1$ is not necessarily aligned with the channel length direction of the transistor $M_{Si}1$. The channel length direction denotes a direction in which carriers move at the shortest distance between a pair of impurity regions serving as a source region and a drain region. The channel width direction denotes a direction perpendicular to the channel length direction.

The transistor $M_{Si}1$ may include a channel formation region in a semiconductor film or a semiconductor substrate of silicon, germanium, or the like in an amorphous, microcrystalline, polycrystalline, or single crystal state. Alternatively, the transistor $M_{Si}1$ may include a channel formation region in an oxide semiconductor film or an oxide semiconductor substrate. In the case where the transistors each include a channel formation region in an oxide semiconductor film or an oxide semiconductor substrate, the transistor $M_{OS}1$ is not necessarily stacked over the transistor $M_{Si}1$, and the transistors $M_{OS}1$ and $M_{Si}1$ may be formed in the same layer.

In the case where the transistor $M_{Si}1$ is formed using a silicon thin film, any of the following can be used for the thin film: amorphous silicon formed by sputtering or chemical vapor deposition (CVD) such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor $M_{Si}1$ is formed can be, for example, a silicon substrate, a germanium substrate, or a silicon germanium substrate. In FIG. 8, a single crystal silicon substrate is used as the substrate 400.

The transistor $M_{Si}1$ is electrically isolated by element isolation. Trench isolation (e.g., shallow trench isolation (STI)) or the like can be used as the element isolation. In FIG. 8, the transistor $M_{Si}1$ is electrically isolated by trench isolation. Specifically, in FIG. 8, the transistor $M_{Si}1$ is electrically isolated by element isolation using an element isolation region 401 formed in such a manner that an insulator including silicon oxide or the like is buried in a trench formed in the substrate 400 by etching or the like and then the insulator is removed partly by etching or the like.

On a projection of the substrate 400 in a region other than the trench, impurity regions 402 and 403 of the transistor $M_{Si}1$ and a channel formation region 404 positioned between the impurity regions 402 and 403 are provided. The transistor $M_{Si}1$ includes an insulating film 405 covering the channel formation region 404 and a gate electrode 406 overlapping with the channel formation region 404 with the insulating film 405 positioned therebetween.

In the transistor $M_{Si}1$, a side portion and an upper portion of the projection in the channel formation region 404 overlaps with the gate electrode 406 with the insulating film 405 positioned therebetween, so that carriers flow in a wide area (including a side portion and an upper portion of the channel formation region 404). Thus, the area of the transistor $M_{Si}1$ in the substrate can be small, and the amount of transfer of carriers in the transistor $M_{Si}1$ can be increased. As a result, the on-state current and field-effect mobility of the transistor $M_{Si}1$ are increased. In particular, if the width (channel width) of the projection in the channel formation region 404 in a channel width direction is denoted by W and the film thickness of the projection in the channel formation region 404 is denoted by T, carriers flow in a wider area when the aspect ratio that corresponds to the ratio of the film thickness T to the channel width W is high. Consequently, the on-state current and field-effect mobility of the transistor $M_{Si}1$ can be further increased.

Note that in the case of the transistor $M_{Si}1$ formed using a bulk semiconductor substrate, the aspect ratio is preferably 0.5 or higher, more preferably 1 or higher.

An insulating film 411 is provided over the transistor $M_{Si}1$. Openings are formed in the insulating film 411. In the openings, conductive films 412 and 413 electrically connected to the impurity regions 402 and 403, respectively, and a conductive film 414 electrically connected to the gate electrode 406 are formed.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having an effect of blocking diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421. The transistor $M_{OS}1$ is provided over the insulating film 422.

The transistor $M_{OS}1$ includes, over the insulating film 422, a semiconductor film 430 including an oxide semiconductor; conductive films 432 and 433 that are electrically connected to the semiconductor film 430 and function as a source electrode and a drain electrode; a gate insulating film 431 covering the semiconductor film 430; and a gate electrode 434 overlapping with the semiconductor film 430 with the gate insulating film 431 positioned therebetween. Note that an opening is provided in the insulating films 420 to 422, and the conductive film 433 is connected to the conductive film 418 through the opening.

The transistor $M_{OS}1$ may further include a gate electrode (back gate electrode) overlapping with the semiconductor film 430 with the insulating film 422 positioned therebetween. When the transistor $M_{OS}1$ includes a pair of gate electrodes, a signal for controlling an on state or an off state may be supplied to one of the gate electrodes, and the other of the gate electrodes may be supplied with a potential from another element. In that case, potentials at the same level may be supplied to the pair of gate electrodes, or a fixed potential such as a ground potential may be supplied only to the other of the gate electrodes. By controlling the level of a potential applied to the other of the gate electrodes, the threshold voltage of the transistor can be controlled.

In FIG. 8, the transistor $M_{OS}1$ has a single-gate structure where one channel formation region corresponding to one gate electrode 434 is provided. The structure of the transistor $M_{OS}1$ is not limited to this structure. For example, the transistor $M_{OS}1$ may have a multi-channel structure where a plurality of channel formation regions are formed in one oxide semiconductor layer.

In the transistor $M_{OS}1$, the semiconductor film 430 includes oxide semiconductor films 430a to 430c stacked sequentially over the insulating film 422. Note that in one embodiment of the present invention, the semiconductor film 430 of the transistor $M_{OS}1$ may be formed using a single-layer metal oxide film.

The insulating film 422 preferably has a function of supplying part of oxygen to the oxide semiconductor films 430a to 430c by heating. In addition, the insulating film 422 preferably has few defects, typically, spin density at g=2.001 due to a dangling bond of silicon is preferably lower than or equal to $1 \times 10^{18}$ spins/cm³ when measured by electron spin resonance (ESR) spectroscopy.

The insulating film 422 is preferably formed using an oxide to have a function of supplying part of oxygen to the oxide semiconductor films 430a to 430c by heating. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by plasma-enhanced CVD, sputtering, or the like.

Note that in this specification, oxynitride contains more oxygen than nitrogen, and nitride oxide contains more nitrogen than oxygen.

In the transistor $M_{OS}1$, the gate electrode 434 overlaps with end portions of the oxide semiconductor film 430b including a channel formation region that do not overlap with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, in the end portion of the oxide semiconductor film, oxygen bonded to the metal element is easily eliminated, so that an oxygen vacancy is easily formed; thus, the oxide semiconductor film easily has n-type conductivity. An electric field applied to the end portions can be controlled by controlling the potential of the gate electrode 434 because the end portions of the oxide semiconductor film 430b that do not overlap with the conductive films 432 and 433 overlap with the gate electrode 434 in the transistor $M_{OS}1$ in FIG. 8. Consequently, current that flows between the conductive films 432 and 433 through the end portions of the oxide semiconductor film 430b can be controlled by the potential applied to the gate electrode 434. Such a structure of the transistor $M_{OS}1$ is referred to as a surrounded channel (s-channel) structure.

With the s-channel structure, specifically, when a potential at which the transistor $M_{OS}1$ is turned off is supplied to the gate electrode 434, the amount of off-state current that flows between the conductive films 432 and 433 through the end portions can be reduced. For this reason, in the transistor $M_{OS}1$, even when the distance between the conductive films 432 and 433 at the end portions of the oxide semiconductor film 430b is reduced as a result of reducing the channel length to obtain high on-state current, the transistor $M_{OS}1$ can have low off-state current. Consequently, with the short channel length, the transistor $M_{OS}1$ can have high on-state current when it is on and have low off-state current when it is off.

With the s-channel structure, specifically, when a potential at which the transistor $M_{OS}1$ is turned on is supplied to the gate electrode 434, the amount of current that flows between the conductive films 432 and 433 through the end portions of the oxide semiconductor film 430b can be increased. The current contributes to an increase in the field-effect mobility and on-state current of the transistor $M_{OS}1$. When the end portions of the oxide semiconductor film 430b overlap with the gate electrode 434, carriers flow in a wide region of the oxide semiconductor film 430b without being limited to a region in the vicinity of the interface between the oxide semiconductor film 430b and the gate insulating film 431, which results in an increase in the amount of carrier movement in the transistor $M_{OS}1$. As a result, the on-state current of the transistor $M_{OS}1$ is increased, and the field-effect mobility is increased. Typically, the field-effect mobility is greater than or equal to 10 cm²/V·s or greater than or equal to 20 cm²N·s. Note that here, the field-effect mobility is not an approximate value of the mobility as the physical property of the oxide semiconductor film but is an index of current drive capability and the apparent field-effect mobility of a saturation region of the transistor.

Although the device structure example of the semiconductor device is illustrated in FIG. 8, the device structure is not limited to this structure. For example, a structure illustrated in FIG. 9 can be employed.

Embodiment 3

In this embodiment, an OS transistor, an oxide semiconductor, and the like are described.
<Structure of Oxide Semiconductor>

An oxide semiconductor layer of an OS transistor can be formed using one oxide semiconductor film or a stacked film of two or more oxide semiconductor films. An oxide semiconductor film is classified roughly into a single-crystal oxide semiconductor film and a non-single-crystal oxide semiconductor film. The non-single-crystal oxide semiconductor film includes a c-axis aligned crystalline oxide semiconductor (CAAC-OS) film, a polycrystalline oxide semiconductor film, a microcrystalline oxide semiconductor film, an amorphous oxide semiconductor film, and the like. An oxide semiconductor film included in a semiconductor device may be a stacked film including two or more films of an amorphous oxide semiconductor film, a microcrystalline oxide semiconductor film, and a CAAC-OS film, for example. In the case where the oxide semiconductor film has a plurality of structures, the structures can be analyzed using nanobeam electron diffraction in some cases.

<CAAC-OS>

A CAAC-OS is an oxide semiconductor having a plurality of c-axis aligned crystal parts. With a transmission electron microscope (TEM), a combined analysis image (also referred to as a high-resolution TEM image) of a bright-field image and a diffraction pattern of the CAAC-OS is observed. Consequently, a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

In a high-resolution cross-sectional TEM image of the CAAC-OS observed in a direction substantially parallel to a sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS observed in a direction substantially perpendicular to the sample surface, metal atoms are arranged in a triangular or hexagonal configuration in the crystal parts. However, there is no regularity of arrangement of metal atoms between different crystal parts.

In an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS, the spots are observed. The high-resolution cross-sectional TEM image and the high-resolution planar TEM image show that the crystal parts in the CAAC-OS have alignment.

Most of the crystal parts included in the CAAC-OS each fit into a cube whose one side is less than 100 nm. Thus, there is a case where a crystal part included in the CAAC-OS fits into a cube whose one side is less than 10 nm, less than 5 nm, or less than 3 nm. Note that when a plurality of crystal parts included in the CAAC-OS are connected, one large crystal region is formed in some cases. For example, a crystal region with an area of larger than or equal to 2500 nm², larger than or equal to 5 μm², or larger than or equal to 1000 μm² is observed in some cases in the plan high-resolution TEM image.

The CAAC-OS is subjected to structural analysis with an X-ray diffraction (XRD) apparatus. For example, when the CAAC-OS film including an InGaZnO₄ crystal is analyzed by an out-of-plane method, a peak appears frequently when the diffraction angle (2θ) is around 31°. This peak is derived from the (009) plane of the InGaZnO₄ crystal, which indicates that crystals in the CAAC-OS have c-axis alignment, and that the c-axes are aligned in a direction substantially perpendicular to the formation surface or the top surface of the CAAC-OS.

When the CAAC-OS is analyzed by an in-plane method in which an X-ray enters a sample in a direction substantially perpendicular to the c-axis, a peak appears frequently when 2θ is around 56°. This peak is derived from the (110) plane of the InGaZnO₄ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO₄, six peaks appear. The six peaks are derived from crystal planes equivalent to the (110) plane. On the other hand, in the case of a CAAC-OS, a peak is not clearly observed even when φ scan is performed with 2θ fixed at around 56°.

According to the above results, in the CAAC-OS having c-axis alignment, while the directions of a-axes and b-axes are irregularly oriented between crystal parts, the c-axes are aligned in a direction parallel to a normal vector of a formation surface or a normal vector of a top surface. Thus, each metal atom layer which is arranged in a layered manner and observed in the cross-sectional high-resolution TEM image corresponds to a plane parallel to the a-b plane of the crystal.

The crystal part is formed concurrently with deposition of the CAAC-OS or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS is changed by etching or the like, the c-axis might not be necessarily parallel to a normal vector of a formation surface or a normal vector of a top surface of the CAAC-OS.

In addition, distribution of c-axis aligned crystal parts in the CAAC-OS is not necessarily uniform. For example, in the case where crystal growth leading to the crystal parts of the CAAC-OS occurs from the vicinity of the top surface of the film, the proportion of the c-axis aligned crystal parts in the vicinity of the top surface is higher than that in the vicinity of the formation surface in some cases. Furthermore, when an impurity is added to the CAAC-OS, a region to which the impurity is added is altered, and the proportion of the c-axis aligned crystal parts in the CAAC-OS varies depending on regions, in some cases.

Note that when the CAAC-OS with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS. It is preferable that in the CAAC-OS film, a peak of 2θ appear at around 31° and a peak of 2θ not appear at around 36°.

The CAAC-OS is an oxide semiconductor having low impurity concentration. The impurity is an element other than the main components of the oxide semiconductor, such as hydrogen, carbon, silicon, or a transition metal element. In particular, an element that has higher bonding strength to oxygen than a metal element included in the oxide semiconductor film, such as silicon, disturbs the atomic order of the oxide semiconductor by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor and causes a decrease in crystallinity when it is contained in the oxide semiconductor. Note that the impurity contained in the oxide semiconductor might serve as a carrier trap or a carrier generation source.

The CAAC-OS is an oxide semiconductor having low density of defect states. In some cases, oxygen vacancies in the oxide semiconductor serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor rarely has negative threshold voltage (is rarely normally on). The highly purified intrinsic or substantially highly purified intrinsic oxide semiconductor has few carrier traps. Accordingly, the transistor including the oxide semiconductor has few variations in electrical characteristics and high reliability. Charge trapped by the carrier traps in the oxide semiconductor takes a long time to be released and may behave like fixed charge. Thus, the transistor that includes the oxide semiconductor having high impurity concentration and high density of defect states has unstable electrical characteristics in some cases.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics. Therefore, in an OS transistor using the CAAC-OS, change in electric characteristics due to irradiation with visible light or ultraviolet light is small.

<Microcrystalline Oxide Semiconductor>

A microcrystalline oxide semiconductor film has a region where a crystal part is observed and a region where a crystal part is not clearly observed in a high-resolution TEM image. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS film, a grain boundary cannot be found clearly in the nc-OS film in some cases.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS. Thus, the orientation of the whole film is not observed. Accordingly, in some cases, the nc-OS cannot be distinguished from an amorphous oxide semiconductor depending on an analysis method. For example, when the nc-OS is subjected to structural analysis by an out-of-plane method with an XRD apparatus using an X-ray having a diameter larger than that of a crystal part, a peak which shows a crystal plane does not appear. Furthermore, a halo pattern is shown in a selected-area electron diffraction pattern of the nc-OS obtained by using an electron beam having a probe diameter larger than the diameter of a crystal part (e.g., larger than or equal to 50 nm). Meanwhile, spots are shown in a nanobeam electron diffraction pattern of the nc-OS obtained by using an electron beam having a probe diameter close to or smaller than the diameter of a crystal part. Furthermore, in a nanobeam electron diffraction pattern of the nc-OS, regions with high luminance in a circular (ring) pattern are observed in some cases. Also in a nanobeam electron diffraction pattern of the nc-OS, a plurality of spots are shown in a ring-like region in some cases.

The nc-OS is an oxide semiconductor that has high regularity than an amorphous oxide semiconductor. Thus, the nc-OS has a lower density of defect states than the amorphous oxide semiconductor. Note that there is no regularity of crystal orientation between different crystal parts in the nc-OS; thus, the nc-OS has a higher density of defect states than the CAAC-OS.

<Amorphous Oxide Semiconductor>

An amorphous oxide semiconductor is an oxide semiconductor having disordered atomic arrangement and no crystal part. For example, the amorphous oxide semiconductor does not have a specific state as in quartz.

In a high-resolution TEM image of the amorphous oxide semiconductor, crystal parts cannot be found. When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and a halo pattern appears when the amorphous oxide semiconductor is subjected to nanobeam electron diffraction.

<Amorphous-Like Oxide Semiconductor>

Note that an oxide semiconductor may have a structure having physical properties intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed. In the a-like OS, crystallization occurs by a slight amount of electron beam used for TEM observation and growth of the crystal part is found in some cases. In contrast, crystallization by a slight amount of electron beam used for TEM observation is less observed in the nc-OS film having good quality.

Embodiment 4

In this embodiment, an example of a method of manufacturing a semiconductor device is described.

Typical examples of a method of forming a conductive film and a semiconductor film included in a semiconductor device include sputtering and plasma-enhanced CVD. The conductive film and the semiconductor film may be formed by another method, for example, thermal CVD. Metal organic chemical vapor deposition (MOCVD) or atomic layer deposition (ALD) can be employed as thermal CVD, for example.

Thermal CVD does not generate plasma and thus has an advantage that no defect due to plasma damage is caused. Deposition by thermal CVD may be performed in such a manner that the pressure in a chamber is set to an atmospheric pressure or a reduced pressure, and a source gas and an oxidizer are supplied to the chamber at the same time and react with each other in the vicinity of the substrate or over the substrate.

Deposition by ALD may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at the same time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated more than once until desired thickness is obtained, so that a thin film with excellent step coverage can be formed. The thickness of the thin film can be adjusted by the number of repetition times of the sequence of the gas introduction; therefore, ALD makes it possible to accurately adjust thickness and thus is suitable for manufacturing a minute FET.

The conductive film and the semiconductor film that are described in the above embodiment can be formed by thermal CVD such as MOCVD or ALD. For example, in the case where an $InGaZnO_X$ (X>0) film is formed, trimethylindium, trimethylgallium, and dimethylzinc are used. Note that the chemical formula of trimethylindium is $(CH_3)_3In$. The chemical formula of trimethylgallium is $(CH_3)_3Ga$. The chemical formula of dimethylzinc is $(CH_3)_2Zn$. Without limitation to the above combination, triethylgallium (chemical formula: $(C_2H_5)_3Ga$) can be used instead of trimethylgallium and diethylzinc (chemical formula: $(C_2H_5)_2Zn$) can be used instead of dimethylzinc.

For example, in the case where a tungsten film is formed using a deposition apparatus employing ALD, a $WF_6$ gas and a $B_2H_6$ gas are sequentially introduced more than once to form an initial tungsten film, and then a $WF_6$ gas and an $H_2$ gas are introduced at the same time, so that a tungsten film is formed. Note that an $SiH_4$ gas may be used instead of a $B_2H_6$ gas.

For example, in the case where an oxide semiconductor film, e.g., an $InGaZnO_X$ (X>0) film is formed using a deposition apparatus employing ALD, an $In(CH_3)_3$ gas and an $O_3$ gas are sequentially introduced more than once to form an $InO_2$ layer, a $Ga(CH_3)_3$ gas and an $O_3$ gas are introduced at the same time to form a GaO layer, and then a $Zn(CH_3)_2$ gas and an $O_3$ gas are introduced at the same time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing these gases. Note that although an $H_2O$ gas that is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Embodiment 5

In this embodiment, examples in which a semiconductor device is used in an electronic component, examples in which a semiconductor device is used in an electronic device including the electronic component, and the like are described.

Figure 10A:
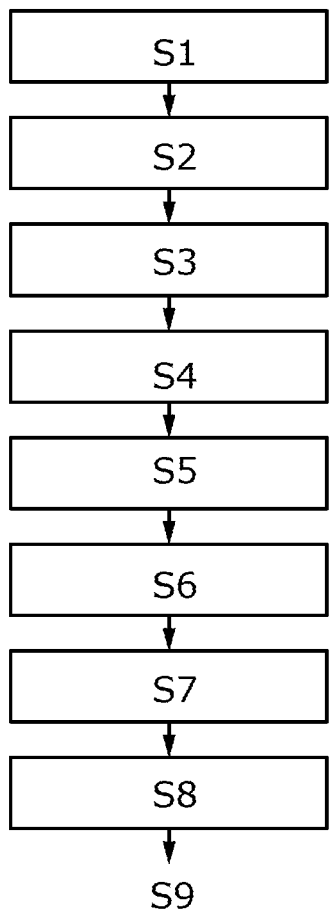
FIG. 10A is a flow chart showing a method of manufacturing an electronic component.

FIG. 10A is a flow chart showing an example of a method of manufacturing a semiconductor device used in an electronic component. The electronic component is also referred to as a semiconductor package or an IC package. This electronic component has a plurality of standards and names depending on a terminal extraction direction and a terminal shape. Thus, examples of the electronic component are described in this embodiment.

A semiconductor device including a transistor can be completed after an assembly process (post-process) by using a plurality of components that can be detached and attached from and to a printed wiring board in combination. The post-process can be finished through each step in FIG. 10A. Specifically, after an element substrate obtained in the preceding process is completed (Step S1), a rear surface of the substrate is ground (Step S2). By thinning the substrate at this stage, the warpage or the like of the substrate in the preceding process is reduced and the component is downsized.

The rear surface of the substrate is ground so that the substrate is divided into a plurality of chips in a dicing process. Then, the divided chips are separately picked up to be mounted on and bonded to a lead frame in a die bonding process (Step S3). In this die bonding process, the chip is bonded to the lead frame by an appropriate method depending on a product, for example, bonding with a resin or a tape. Note that in the die bonding process, bonding between the chip and the lead frame may be conducted by mounting the chip on an interposer.

Then, wire bonding is performed to electrically connect lead of the lead frame to an electrode on the chip with a metal fine line (wire) (Step S4). A silver line or a gold line can be used as the metal fine line. Ball bonding or wedge bonding can be used as the wire bonding.

A molding process is performed to seal the wire bonded chip with an epoxy resin or the like (Step S5). With the molding process, the electronic component is filled with the resin, so that damage to a mounted circuit portion or wire due to mechanical external force can be reduced. Furthermore, deterioration in characteristics due to moisture or dust can be reduced.

Next, plate processing is performed on the lead of the lead frame. After that, the lead is cut and processed (Step S6). This plate processing prevents rust of the lead and facilitates soldering at the time of mounting the chip on a printed wiring board in a later step.

Then, printing (marking) is performed on a surface of the package (Step S7). Through the final inspection process (Step S8), the electronic component is completed (Step S9).

The above electronic component can include the semiconductor device described in the above embodiment. Thus, the electronic component can consume less power and have smaller size.

Figure 10B:
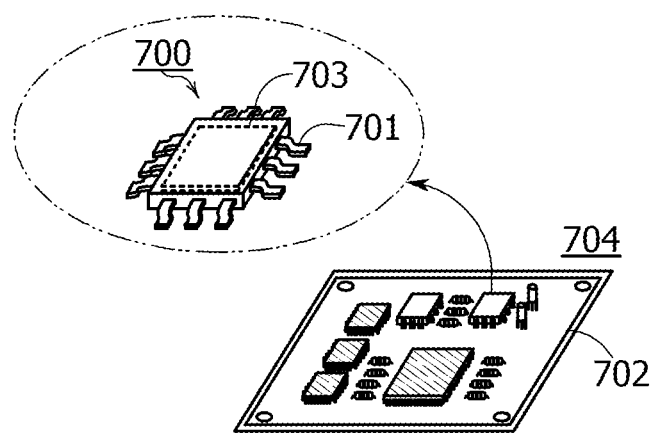
FIG. 10B is a perspective schematic diagram illustrating an example of a structure of the electronic component.

FIG. 10B is a schematic perspective view of the completed electronic component. FIG. 10B illustrates a schematic perspective view of a quad flat package (QFP) as an example of the electronic component. As illustrated in FIG. 10B, an electronic component 700 includes a lead 701 and a circuit portion 703. The electronic component 700 is mounted on a printed wiring board 702, for example. When a plurality of electronic components 700 are used in combination and electrically connected to each other over the printed wiring board 702, the electronic components 700 can be mounted on an electronic device. A completed circuit board 704 is provided in the electronic device or the like. The circuit 10 (FIG. 1) can supply an optimum potential for analog circuit operation, and thus can be used as various analog circuits. By providing the circuit 10 and an analog circuit (e.g., the sensor unit 150) in the circuit portion 703, the electronic component 700 can be a high-performance IC chip for analog signal processing. Furthermore, the electronic component 700 including the circuit 10, the sensor unit 150, and a control circuit (a logic circuit) can be used as a processor that executes a variety of processings, such as a microcontroller unit (MCU) or a wireless tag.

The electronic component 700 can be used as electronic component (an IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Specific examples of the electronic devices are illustrated in FIG. 11.

A display device 8000 corresponds to a display device for TV broadcast reception and includes a housing 8001, a display portion 8002, speaker portions 8003, an electronic component 8004, and the like. The electronic component 8004 of one embodiment of the present invention is provided in the housing 8001.

A semiconductor display device such as a liquid crystal display device, a light-emitting device in which a light-emitting element such as an organic EL element is provided in each pixel, an electrophoresis display device, a digital micromirror device (DMD), a plasma display panel (PDP), or a field emission display (FED) can be used for the display portion 8002. Note that the display device includes, in its category, all of information display devices for personal computers, advertisement displays, and the like besides TV broadcast reception.

Figure 11:
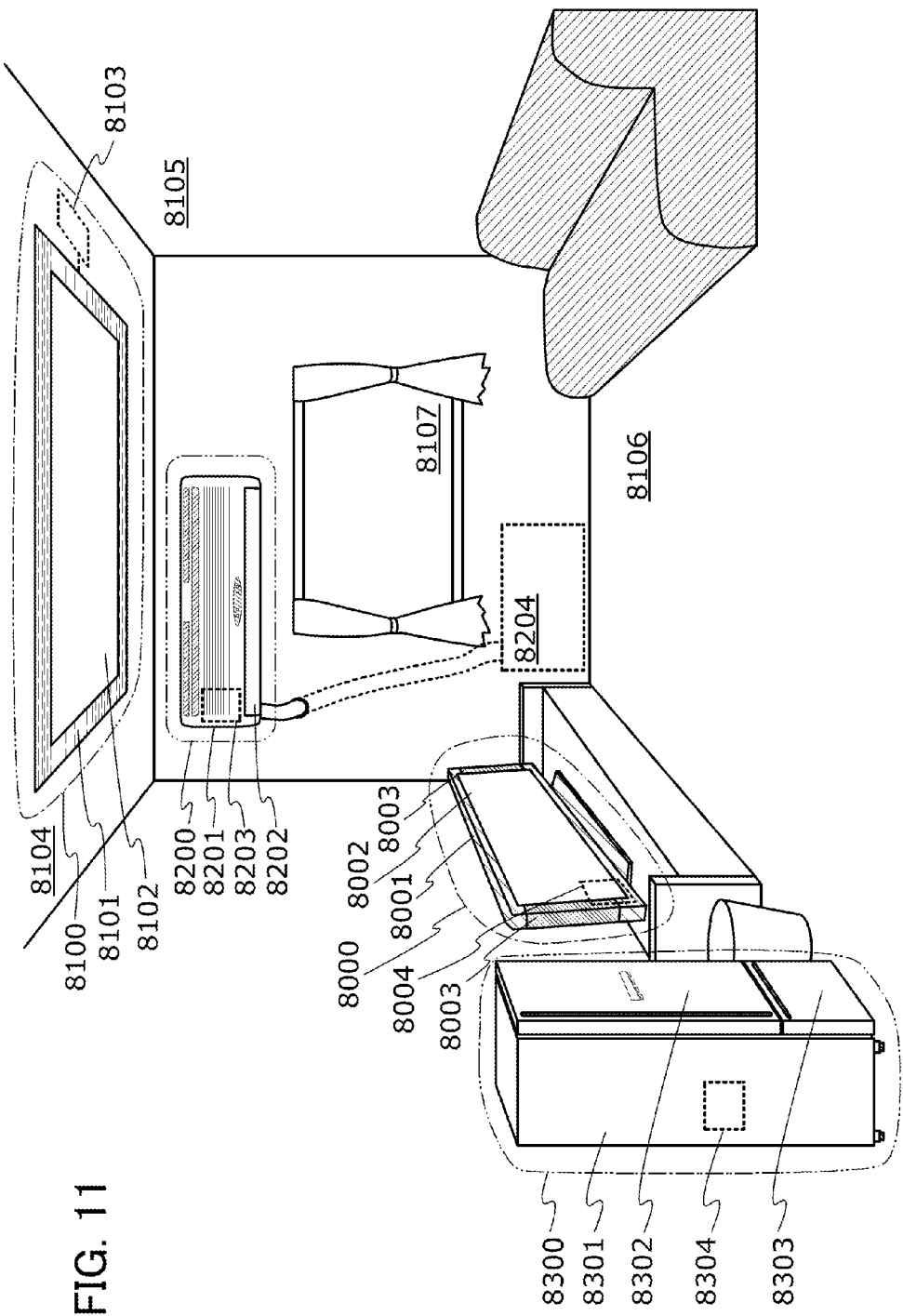
FIG. 11 illustrates examples of electronic devices.

As illustrated in FIG. 11, a lighting device 8100 is an installation lighting device including a housing 8101, a light source 8102, an electronic component 8103, and the like. As the light source 8102, an artificial light source which emits light artificially by using power can be used. Specifically, an incandescent lamp, a discharge lamp such as a fluorescent lamp, and light-emitting elements such as an LED and an organic EL element are given as examples of the artificial light source. For example, by incorporating a light sensor unit in the electronic component 8103, the lighting device 8100 can have a function of automatically adjusting the brightness of the light source 8102 in accordance with room brightness. Although FIG. 11 illustrates an example where the lighting device 8100 is provided on a ceiling 8104, the lighting device 8100 may be provided on, for example, a sidewall 8105, a floor 8106, or a window 8107. The lighting device is not limited to an installation lighting device and may be a tabletop lighting device, a portable lighting device, or the like.

An air conditioner including an indoor unit 8200 and an outdoor unit 8204 illustrated in FIG. 11 is an example of an electronic device including an electronic component 8203 of one embodiment of the present invention. Specifically, the indoor unit 8200 includes a housing 8201, an air outlet 8202, the electronic component 8203, and the like. Although FIG. 11 illustrates the case where the electronic component 8203 is provided in the indoor unit 8200, the electronic component 8203 may be provided in the outdoor unit 8204. Alternatively, the electronic component 8203 may be provided in each of the indoor unit 8200 and the outdoor unit 8204. For example, an infrared light sensor or a temperature sensor unit is incorporated in the electronic component 8203 as a sensor unit. Although FIG. 11 illustrates a separated air conditioner including the indoor unit and the outdoor unit as an example, it may be an air conditioner in which the functions of an indoor unit and an outdoor unit are integrated in one housing.

An electric refrigerator-freezer 8300 includes a housing 8301, a door for a refrigerator 8302, a door for a freezer 8303, an electronic component 8304, and the like. The electronic component 8304 is provided in the housing 8301.

FIG. 11 illustrates examples of household appliances using the electronic component 700. The electronic component 700 can be incorporated in a variety of household appliances such as a microwave oven, a dishwasher, a washing machine, or a vacuum cleaner. Electronic devices in which the electronic component 700 can be incorporated are not limited to household appliances. As described above, the electronic component 700 can be used in a variety of electronic devices, for example, industrial electronic devices, electronic devices used in aircraft, and automobiles.

Electronic devices each including a display portion are given below as examples of semiconductor devices. The examples of the electronic device include television sets, laptop personal computers (PCs), tablet PCs, image reproducing devices provided with recording media (typically, devices which reproduce the content of recording media such as digital versatile discs (DVDs) and have displays for displaying reproduced images), mobile phones, smartphones, portable game consoles, portable information terminals (e.g., tablet information terminals), wearable (e.g., glasses-type, goggle-type, watch-type, and bangle-type) information terminals, e-book readers, cameras (e.g., video cameras and digital still cameras), navigation systems, audio reproducing devices (e.g., car audio systems and digital audio players), copiers, facsimiles, printers, multifunction printers, automated teller machines (ATM), and vending machines. FIGS. 12A to 12F illustrate specific examples of these electronic devices.

Figure 12A:
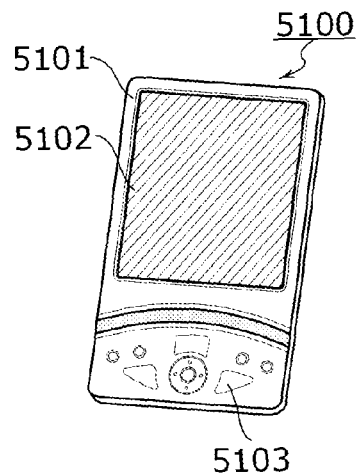
FIGS. 12A to 12F illustrate examples of electronic devices.

FIG. 12A illustrates an example of a portable information terminal. An information terminal 5100 includes a housing 5101, a display portion 5102, operation keys 5103, and the like.

Figure 12B:
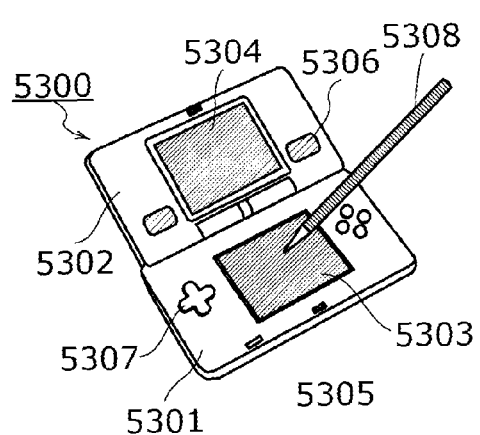

FIG. 12B illustrates an example of a portable game console. A portable game console 5300 includes a housing 5301, a housing 5302, a display portion 5303, a display portion 5304, a microphone 5305, a speaker 5306, an operation key 5307, a stylus 5308, and the like. Although the portable game console 5300 includes two display portions (5303 and 5304), the number of display portions are not limited to two, and may be one or three or more.

Figure 12C:
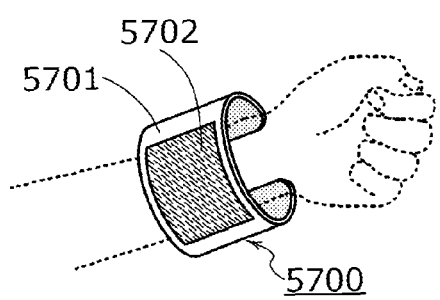

FIG. 12C illustrates an example of a bangle-type information terminal. An information terminal 5700 includes a housing 5701, a display portion 5702, and the like. The display portion 5702 is supported by the housing 5701 with a curved surface. A display panel formed with a flexible substrate is provided in the display portion 5702, whereby the information terminal 5700 can be a user-friendly information terminal that is flexible and lightweight.

Figure 12D:
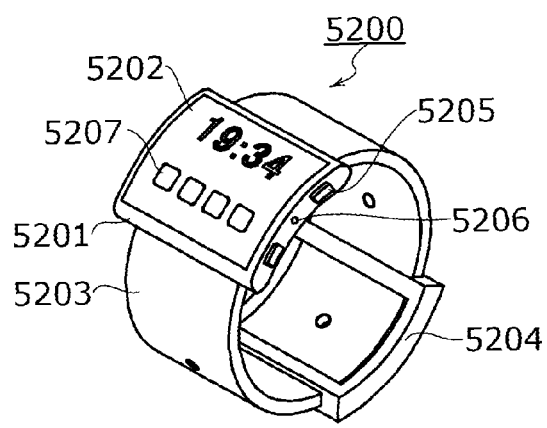

FIG. 12D illustrates an example of a watch-type information terminal. An information terminal 5200 includes a housing 5201, a display portion 5202, a band 5203, a buckle 5204, operation buttons 5205, an input output terminal 5206, and the like. The information terminal 5200 is capable of executing a variety of applications such as mobile phone calls, e-mailing, viewing and editing texts, music reproduction, Internet communication, and computer games.

The display surface of the display portion 5202 is bent, and images can be displayed on the bent display surface. The display portion 5202 includes a touch sensor, and operation can be performed by touching the screen with a finger, a stylus, or the like. For example, by touching an icon 5207 displayed on the display portion 5202, an application can be started. With the operation button 5205, a variety of functions such as time setting, ON/OFF of the power, ON/OFF of wireless communication, setting and cancellation of a manner mode, and setting and cancellation of a power saving mode can be performed. For example, the functions of the operation button 5205 can be set by setting the operation system incorporated in the information terminal 5200.

The information terminal 5200 can employ near field communication conformable to a communication standard. In that case, for example, mutual communication between the information terminal 5200 and a headset capable of wireless communication can be performed, and thus hands-free calling is possible. Moreover, the information terminal 5200 includes the input output terminal 5206, and data can be directly transmitted to and received from another information terminal via a connector. Charging via the input output terminal 5206 is possible. Note that the charging operation may be performed by wireless power feeding without using the input output terminal 5206.

Figure 12E:
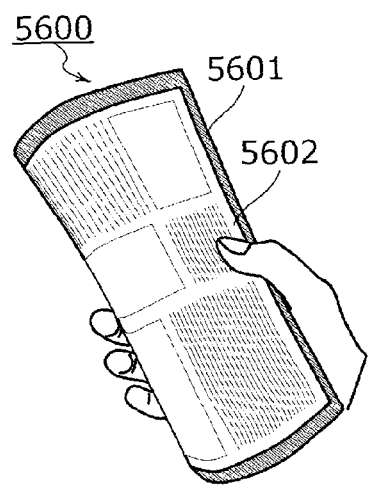

FIG. 12E illustrates an example of an e-book reader. An e-book reader 5600 includes a housing 5601, a display portion 5602, and the like. A display panel formed with a flexible substrate is provided in the display portion 5602. Thus, the e-book reader 5600 can be a user-friendly e-book reader that is flexible and lightweight.

Figure 12F:
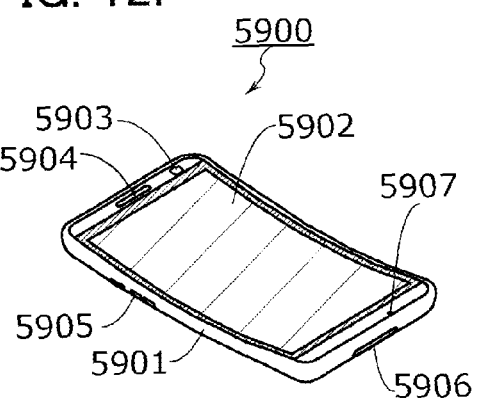

FIG. 12F illustrates an example of an information terminal. An information terminal 5900 includes a housing 5901, a display portion 5902, a microphone 5907, a speaker portion 5904, a camera 5903, an external connection portion 5906, an operation button 5905, and the like. A display panel formed with a flexible substrate is provided in the display portion 5902. The information terminal 5900 can be used as, for example, a smartphone, a mobile phone, a tablet information terminal, a tablet PC, or an e-book reader.

Additional information about this specification, the drawings, and the like is described below.

In one embodiment of the present invention, a variety of switches can be used as a switch. The switch is conducting or not conducting (is turned on or off) to determine whether current flows. Alternatively, the switch has a function of determining and changing a current path. For example, the switch has a function of determining whether current can flow through a path 1 or a path 2 and switching the paths. Examples of the switch include an electrical switch and a mechanical switch. That is, any element can be used as a switch as long as it can control current, without limitation to a certain element. Examples of the switch include a transistor (e.g., a bipolar transistor or a metal-oxide-semiconductor (MOS) transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined. An example of a mechanical switch is a switch formed using a micro electro mechanical system (MEMS) technology, such as a digital micromirror device (DMD). The switch includes an electrode that can be moved mechanically, and operates to control conduction and non-conduction with the movement of the electrode.

In one embodiment of the present invention, there is no particular limitation on the device structure of a capacitor intentionally provided as an element. For example, either a MIM capacitor or a MOS capacitor can be used.

In this specification and the like, the term "parallel" indicates that an angle formed between two straight lines is −10° to 10°, and accordingly includes the case where the angle is −5° to 5°. In addition, the term "perpendicular" indicates that an angle formed between two straight lines is 80° to 100°, and accordingly includes the case where the angle is 85° to 95°.

In this specification and the like, trigonal and rhombohedral crystal systems are included in a hexagonal crystal system.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in that order," "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Note that content (or may be part of the content) described in one embodiment may be applied to, combined with, or replaced by different content (or may be part of the different content) described in the embodiment and/or content (or may be part of the content) described in one or more different embodiments.

Note that in each embodiment, content described in the embodiment is content described with reference to a variety of diagrams or content described with a text described in the specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in another embodiment or other embodiments, much more diagrams can be formed.

Note that content that is not specified in any drawing or text in the specification can be excluded from one embodiment of the invention. Alternatively, when the range of a value that is defined by the maximum and minimum values is described, the range is narrowed freely and part of the range is removed, so that one embodiment of the invention excluding part of the range can be constructed. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection in the invention. It can be specified that the circuit does not include a capacitor with a particular connection in the invention. For example, it can be specified that a sixth transistor whose gate is connected to a gate of the third transistor is not included in the invention. It can be specified that a capacitor whose first electrode is connected to the gate of the third transistor is not included in the invention, for example.

As another specific example, when the expression "voltage is preferably higher than or equal to 3 V and lower than or equal to 10 V" is used to describe a given value, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than 9 V and higher than 9 V and lower than or equal to 10 V in the invention. Note that even when the expression "a value is preferably in a certain range" or "a value preferably satisfies a certain condition" is used, for example, the value is not limited to the description. In other words, the description of a value that includes a term "preferable", "preferably", or the like does not necessarily limit the value.

As another specific example, when the expression "voltage is preferably 10 V" is used to describe a given value, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, when the expression "a film is an insulating film" is used to describe properties of a material, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, when the expression "a film is provided between an A film and a B film" is used to describe a given layered structure, for example, it can be specified that the case where the film is a stacked film of four or more layers is excluded from the invention. For example, it can be specified that the case where a conductive film is provided between the A film and the film is excluded from the invention.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention is clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected is plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least the function of a circuit is specified. In other words, one embodiment of the present invention is clear when the function of a circuit is specified. Furthermore, it can be determined that one embodiment of the present invention in which a function is specified is disclosed in this specification and the like in some cases. Thus, when the connection portion of a circuit is specified, the circuit is disclosed as one embodiment of the invention even if a function is not specified, and one embodiment of the invention can be constituted. Alternatively, when the function of a circuit is specified, the circuit is disclosed as one embodiment of the invention even when a connection portion is not specified, and one embodiment of the invention can be constituted.

Note that in this specification and the like, in a diagram or a text described in one embodiment, part of the diagram or the text is taken out, and one embodiment of the invention can be constituted. Thus, in the case where a diagram or a text related to a certain portion is described, the context taken out from part of the diagram or the text is also disclosed as one embodiment of the invention, and one embodiment of the invention can be constituted. One embodiment of the invention is clear. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, M circuit elements (e.g., transistors or capacitors) (M is an integer, where M<N) are taken out from a circuit diagram in which N circuit elements (e.g., transistors or capacitors) (N is an integer) are provided, and one embodiment of the invention can be constituted. As another example, M layers (M is an integer, where M<N) are taken out from a cross-sectional view in which N layers (N is an integer) are provided, and one embodiment of the invention can be constituted. As another example, M elements (M is an integer, where M<N) are taken out from a flow chart in which N elements (N is an integer) are provided, and one embodiment of the invention can be constituted. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in this specification and the like, in a diagram or a text described in one embodiment, in the case where at least one specific example is described, it will be readily appreciated by those skilled in the art that a broader concept of the specific example can be derived. Thus, in the diagram or the text described in one embodiment, in the case where at least one specific example is described, a broader concept of the specific example is disclosed as one embodiment of the invention, and one embodiment of the invention can be constituted. One embodiment of the invention is clear.

Note that in this specification and the like, content described in at least a diagram (or may be part of the diagram) is disclosed as one embodiment of the invention, and one embodiment of the invention can be constituted. Thus, when certain content is described in a diagram, the content is disclosed as one embodiment of the invention even when the content is not described with a text, and one embodiment of the invention can be constituted. Similarly, part of a diagram that is taken out from the diagram is disclosed as one embodiment of the invention, and one embodiment of the invention can be constituted. One embodiment of the invention is clear.

This application is based on Japanese Patent Application serial no. 2014-045282 filed with Japan Patent Office on Mar. 7, 2014, the entire contents of which are hereby incorporated by reference.

What is claimed is:

1. A semiconductor device comprising:
a first memory circuit;
a circuit; and
a second memory circuit,
wherein the circuit converts a digital signal input from the second memory circuit into an analog signal,
wherein the first memory circuit includes an input node, an output node, a first transistor, and a first capacitor,
wherein the first capacitor is electrically connected to the output node,
wherein the first transistor controls a conduction state between the input node and the output node,
wherein the analog signal is input to the input node, and
wherein a channel in the first transistor includes an oxide semiconductor.

2. The semiconductor device according to claim 1,
wherein the second memory circuit includes a memory cell and a wiring,
wherein the memory cell includes a second transistor, a third transistor, a second capacitor, and a node,
wherein the second transistor controls a conduction state between the wiring and the node,
wherein a gate of the third transistor and the second capacitor are electrically connected to the node, and
wherein a channel in the second transistor includes an oxide semiconductor.

3. The semiconductor device according to claim 1,
wherein the second memory circuit includes a memory cell and a wiring,
wherein the memory cell includes a second transistor, a third transistor, a fourth transistor, and a node,
wherein the second transistor controls a conduction state between the wiring and the node,
wherein the third transistor and the fourth transistor are electrically connected to each other in series,
wherein a gate of the third transistor is electrically connected to the node, and
wherein a channel in the second transistor includes an oxide semiconductor.

4. A semiconductor device comprising:
the semiconductor device according to claim 1; and
an operational amplifier electrically connected to the output node.

5. A semiconductor device comprising:
the semiconductor device according to claim 1;
an operational amplifier electrically connected to the output node; and
a sensor circuit electrically connected to an input node of the operational amplifier.

6. A semiconductor device comprising:
the semiconductor device according to claim 1;
an operational amplifier electrically connected to the output node;
a sensor circuit electrically connected to the operational amplifier; and
an antenna.

7. An electronic device comprising:
the semiconductor device according to claim 1; and
at least one of a display portion, a housing, a microphone, a speaker, and an operation key.

8. A semiconductor device comprising:
a circuit;
a digital-to-analog converter circuit; and
a memory device,
wherein the digital-to-analog converter circuit converts a digital signal input from the memory device into an analog signal,
wherein the circuit includes an input node, an output node, a first transistor, and a first capacitor,
wherein the first capacitor is electrically connected to the output node,
wherein the first transistor controls a conduction state between the input node and the output node,
wherein the analog signal is input to the input node, and
wherein a channel in the first transistor includes an oxide semiconductor.

9. The semiconductor device according to claim 8,
wherein the memory device includes a memory cell and a wiring,
wherein the memory cell includes a second transistor, a third transistor, a second capacitor, and a node,
wherein the second transistor controls a conduction state between the wiring and the node,
wherein a gate of the third transistor and the second capacitor are electrically connected to the node, and
wherein a channel in the second transistor includes an oxide semiconductor.

10. The semiconductor device according to claim 8,
wherein the memory device includes a memory cell and a wiring,
wherein the memory cell includes a second transistor, a third transistor, a fourth transistor, and a node,
wherein the second transistor controls a conduction state between the wiring and the node,
wherein the third transistor and the fourth transistor are electrically connected to each other in series,
wherein a gate of the third transistor is electrically connected to the node, and
wherein a channel in the second transistor includes an oxide semiconductor.

11. A semiconductor device comprising:
the semiconductor device according to claim 8; and
an operational amplifier electrically connected to the output node.

12. A semiconductor device comprising:
the semiconductor device according to claim 8;
an operational amplifier electrically connected to the output node; and
a sensor circuit electrically connected to an input node of the operational amplifier.

13. A semiconductor device comprising:
the semiconductor device according to claim 8;
an operational amplifier electrically connected to the output node;
a sensor circuit electrically connected to the operational amplifier; and
an antenna.

14. An electronic device comprising:
the semiconductor device according to claim 8; and
at least one of a display portion, a housing, a microphone, a speaker, and an operation key.

* * * * *